(12) United States Patent
Johnson et al.

(10) Patent No.: US 8,564,279 B2
(45) Date of Patent: Oct. 22, 2013

(54) DEVICE AND METHOD FOR MEASURING CURRENT AND POWER IN A PLUG OR RECEPTACLE

(75) Inventors: Kevin M. Johnson, Natick, MA (US);
Greg Hunter, Dover, MA (US);
Matthew D Abelson, Boylston, MA (US)

(73) Assignee: Outsmart Power Systems, LLC, Natick, MA (US)

( * ) Notice: Subject to any disclaimer, the term of this patent is extended or adjusted under 35 U.S.C. 154(b) by 176 days.

(21) Appl. No.: 12/941,775

(22) Filed: Nov. 8, 2010

(65) Prior Publication Data
US 2011/0109301 A1    May 12, 2011

Related U.S. Application Data

(63) Continuation of application No. PCT/US2009/043390, filed on May 8, 2009.

(60) Provisional application No. 61/051,473, filed on May 8, 2008.

(51) Int. Cl.
*G01R 15/18* (2006.01)
*G01R 1/22* (2006.01)

(52) U.S. Cl.
CPC ........................................ *G01R 1/22* (2013.01)
USPC ........................................................ 324/127

(58) Field of Classification Search
None
See application file for complete search history.

(56) References Cited

U.S. PATENT DOCUMENTS

| | | | |
|---|---|---|---|
| 3,739,226 A | | 6/1973 | Seiter et al. |
| 4,002,951 A | * | 1/1977 | Halbeck ............................ 361/45 |
| 4,059,843 A | * | 11/1977 | Girismen ...................... 361/102 |
| 4,121,152 A | | 10/1978 | Hale et al. |
| 4,491,785 A | | 1/1985 | Pecukonis et al. |
| 4,636,914 A | | 1/1987 | Belli |
| 4,755,913 A | | 7/1988 | Sleveland |

(Continued)

FOREIGN PATENT DOCUMENTS

| | | |
|---|---|---|
| JP | 2003259569 | 9/2003 |
| JP | 2004064136 | 2/2004 |

(Continued)

OTHER PUBLICATIONS

U.S. Office Action dated Jan. 23, 2012 issued in related U.S. Appl. No. 12/447,138.

(Continued)

*Primary Examiner* — Paresh Patel
(74) *Attorney, Agent, or Firm* — Grossman, Tucker, Perreault & Pfleger, PLLC

(57) ABSTRACT

An aspect of the present disclosure relates to an electrical receptacle configured to receive a plug having two or more prongs and capable of being connected to an associated load. The electrical receptacle may include a housing and a housing cover mounted on the housing including apertures for receiving at least one of the prongs. In addition, the receptacle may include at least two electrical contacts for engaging the prongs positioned in the housing, a magnetic current sensor defining an opening, wherein the magnetic current sensor opening is operatively coupled to an opening defined by at least one of the apertures. Wherein when one of the prongs is inserted through one of the apertures, the prong extends through the magnetic current sensor and engages at least one of said electrical contacts.

26 Claims, 31 Drawing Sheets

(56) References Cited

U.S. PATENT DOCUMENTS

| | | | |
|---|---|---|---|
| 4,804,957 A | 2/1989 | Selph et al. | |
| 4,871,924 A * | 10/1989 | Sellati | 307/86 |
| 4,980,794 A | 12/1990 | Engel | |
| 4,995,017 A * | 2/1991 | Sellati et al. | 307/86 |
| 5,029,037 A | 7/1991 | Bartelink | |
| 5,153,816 A | 10/1992 | Griffin | |
| 5,365,154 A | 11/1994 | Schneider et al. | |
| 5,424,894 A | 6/1995 | Briscall et al. | |
| 5,485,356 A | 1/1996 | Nguyen | |
| 5,539,354 A | 7/1996 | Carsten | |
| 5,568,399 A | 10/1996 | Sumic | |
| 5,660,459 A | 8/1997 | Appeleberg | |
| 5,670,776 A | 9/1997 | Rothbaum | |
| 5,684,469 A | 11/1997 | Toms | |
| 5,833,350 A | 11/1998 | Moreland | |
| 5,838,226 A | 11/1998 | Houggy et al. | |
| 6,021,034 A | 2/2000 | Chan et al. | |
| 6,026,605 A | 2/2000 | Tippett | |
| 6,055,435 A | 4/2000 | Smith et al. | |
| 6,087,588 A | 7/2000 | Soules | |
| 6,396,391 B1 | 5/2002 | Binder | |
| 6,423,900 B1 | 7/2002 | Soules | |
| 6,518,724 B2 | 2/2003 | Janik | |
| 6,805,469 B1 | 10/2004 | Barton | |
| 6,853,939 B2 | 2/2005 | Coffeen | |
| 6,864,798 B2 | 3/2005 | Janik | |
| 6,867,558 B2 | 3/2005 | Gaus, Jr. et al. | |
| 6,993,289 B2 | 1/2006 | Janik | |
| 7,057,401 B2 | 6/2006 | Blades | |
| 7,082,541 B2 | 7/2006 | Hammond et al. | |
| 7,118,235 B2 | 10/2006 | Barton | |
| 7,209,839 B2 | 4/2007 | Roytelman | |
| 7,253,732 B2 | 8/2007 | Osann, Jr. | |
| 7,276,915 B1 | 10/2007 | Euler et al. | |
| 7,403,598 B2 | 7/2008 | Tyroler et al. | |
| 7,483,524 B2 | 1/2009 | Binder | |
| 7,493,222 B2 | 2/2009 | Bruno | |
| 7,549,785 B2 | 6/2009 | Faunce | |
| 7,688,841 B2 | 3/2010 | Binder | |
| 7,690,949 B2 | 4/2010 | Binder | |
| 7,821,160 B1 | 10/2010 | Roosli et al. | |
| 7,867,035 B2 | 1/2011 | Binder | |
| 7,930,118 B2 * | 4/2011 | Vinden et al. | 702/64 |
| 2002/0086567 A1 | 7/2002 | Cash | |
| 2004/0015340 A1 | 1/2004 | Kadoi et al. | |
| 2004/0131104 A1 | 7/2004 | Seferian | |
| 2004/0142601 A1 | 7/2004 | Luu | |
| 2004/0243377 A1 | 12/2004 | Roytelman | |
| 2005/0184867 A1 | 8/2005 | Osann, Jr. | |
| 2005/0201190 A1 | 9/2005 | Kowalski | |
| 2005/0275979 A1 | 12/2005 | Xu | |
| 2006/0038672 A1 | 2/2006 | Schoettle | |
| 2006/0072271 A1 | 4/2006 | Jones et al. | |
| 2006/0072302 A1 | 4/2006 | Chien | |
| 2006/0077614 A1 | 4/2006 | Bruccoleri et al. | |
| 2006/0262462 A1 | 11/2006 | Barton | |
| 2006/0267788 A1 | 11/2006 | Delany | |
| 2007/0024264 A1 | 2/2007 | Lestician | |
| 2007/0120978 A1 | 5/2007 | Jones et al. | |
| 2007/0227867 A1 | 10/2007 | Yang | |
| 2007/0228183 A1 | 10/2007 | Kennedy et al. | |
| 2008/0012681 A1 * | 1/2008 | Kadar et al. | 337/298 |
| 2008/0024605 A1 | 1/2008 | Osann, Jr. | |
| 2009/0009353 A1 | 1/2009 | Schoettle | |
| 2009/0058193 A1 | 3/2009 | Reid et al. | |
| 2009/0073641 A1 | 3/2009 | Ross | |
| 2009/0322159 A1 | 12/2009 | Dubose et al. | |
| 2010/0084482 A1 | 4/2010 | Kennedy et al. | |
| 2011/0260709 A1 | 10/2011 | Johnson et al. | |

FOREIGN PATENT DOCUMENTS

| | | |
|---|---|---|
| WO | 2005039016 | 4/2005 |
| WO | 2008005225 | 5/2008 |
| WO | 2008052223 | 5/2008 |

OTHER PUBLICATIONS

U.S. Office Action dated Jan. 12, 2012 issued in related U.S. Appl. No. 12/447,131.

U.S. Office Action dated Jul. 5, 2011 issued in related U.S. Appl. No. 12/447,131.

Extended European Search Report dated Dec. 2, 2011 issued in related Patent Application No. 07863633.9-1232.

Extended European Search Report dated Nov. 24, 2011 issued in related Patent Application No. 07863631.3-1232.

International Search Report and Written Opinion dated May 5, 2008 issued in related International Patent Application No. PCT/US07/82909.

International Search Report and Written Opinion dated Apr. 30, 2008 issued in related International Patent Application No. PCT/US07/82912.

International Search Report and Written Opinion dated Jul. 6, 2009 issued in related International Patent Application No. PCT/US2009/043390.

International Preliminary Report on Patentability dated Sep. 15, 2009 issued in related International Patent Application No. PCT/US2009/051581.

International Search Report and Written Opinion dated Sep. 15, 2009 issued in related International Patent Application No. PCT/US2009/051581.

International Search Report and Written Opinion dated Feb. 23, 2010 issued in related International Patent Application No. PCT/US2009/056268.

Whitlock, "Understanding, Finding, and Eliminating Ground Loops," Class Manual Course Codes A14T and B50T, CEDIA Expo 2003.

U.S. Office Action dated Dec. 13, 2010 issued in related U.S. Appl. No. 12/447,131.

U.S. Office Action dated Jul. 23, 2012 issued in U.S. Appl. No. 12/447,131.

Japanese Office Action dated Sep. 4, 2012 issued in Japanese Patent Application No. 2009-534929.

Japanese Office Action dated Oct. 9, 2012 issued in Japanese Patent Application No. 2009-534928.

U.S. Office Action dated May 2, 2012 issued in U.S. Appl. No. 13/041,231.

U.S. Office Action dated Nov. 7, 2012 issued in U.S. Appl. No. 12/447,138.

U.S. Office Action dated Jan. 2, 2013 issued in U.S. Appl. No. 13/041,231.

U.S. Office Action dated Feb. 1, 2013 issued in U.S. Appl. No. 12/447,131.

\* cited by examiner

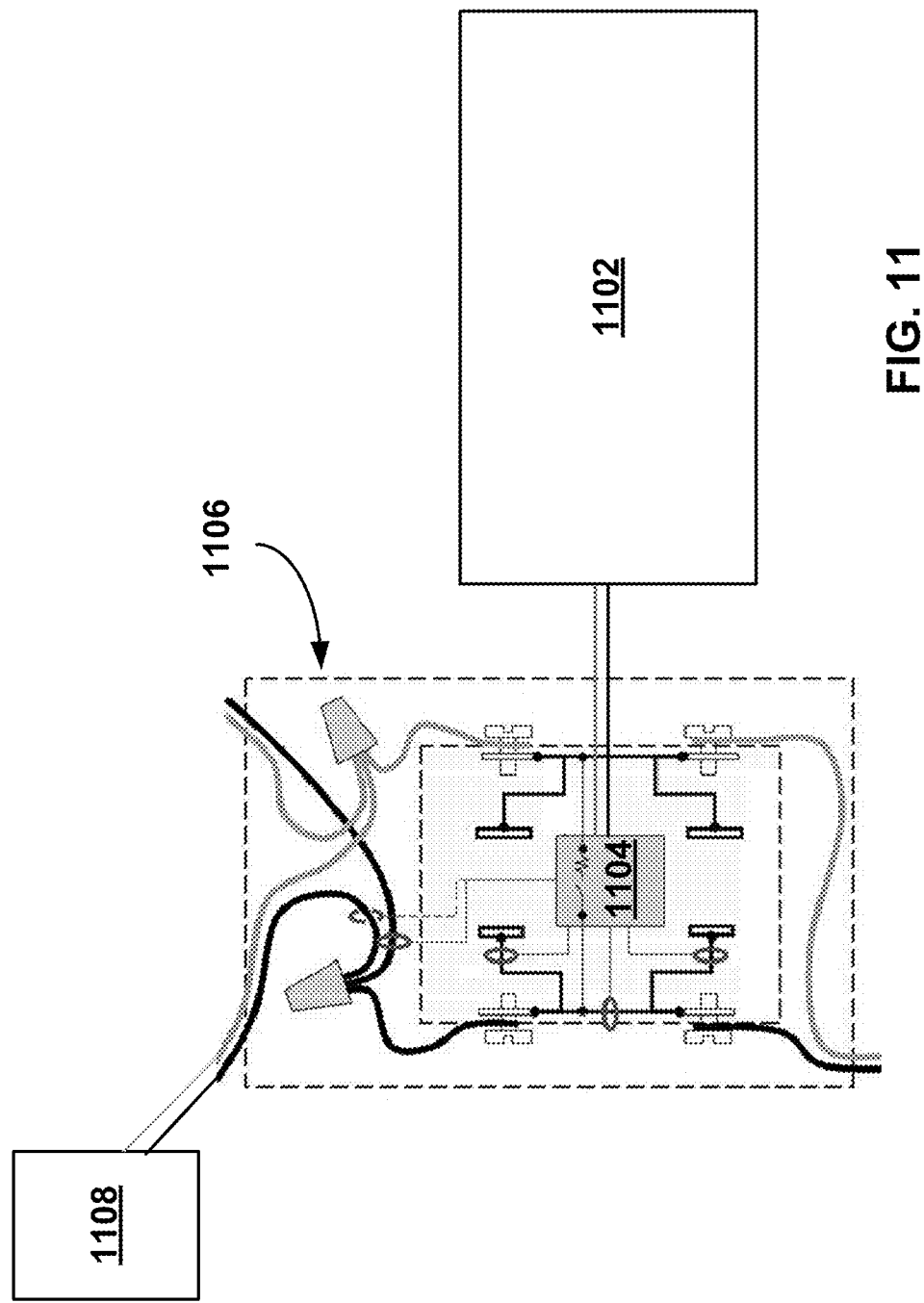

DEVICE AND METHOD FOR MEASURING CURRENT AND POWER IN A PLUG OR RECEPTACLE

CROSS REFERENCES TO RELATED APPLICATIONS

This application is a continuation of International Application Number. PCT/US2009/043390 filed May 8, 2009, which claims benefit of U.S. Provisional Application No. 61/051,473 filed on May 8, 2008, the teachings of which are incorporated herein by reference.

FIELD OF THE INVENTION

The present invention relates generally to electrical systems, and more particularly, to electrical systems that provide for measurement of power and/or current at various points within one or more electrical circuits.

BACKGROUND

With the increasing emphasis on energy costs and efficiency, the ability to properly monitor energy usage within a house or building is becoming ever more important. Monitoring energy usage and costs may provide building owners and/or occupants a better understanding of how to adjust their usage to reduce both their costs and the load on the power system. However, presently many energy monitoring systems require the use of single point measurement devices into which an appliance is plugged and that measurement device plugs into an electrical outlet. Other energy monitoring systems monitor the energy usage of an entire building, but do not monitor single power points. One may use a combination of such devices, which may become cumbersome to manage.

SUMMARY

An aspect of the present disclosure relates to an electrical receptacle configured to receive a plug having two or more prongs and capable of being connected to an associated load. The electrical receptacle may include a housing and a housing cover mounted on the housing including apertures for receiving at least one of the prongs. In addition, the receptacle may include at least two electrical contacts for engaging the prongs positioned in the housing, a magnetic current sensor defining an opening, wherein the magnetic current sensor opening is operatively coupled to an opening defined by at least one of the apertures. Wherein when one of the prongs is inserted through one of the apertures, the prong extends through the magnetic current sensor and engages at least one of said electrical contacts.

Another aspect of the present disclosure relates to an electrical receptacle for receiving a plug having two or more prongs. The receptacle may include a housing and a housing cover mounted on the housing including apertures for receiving at least one of the prongs. In addition, the receptacle may include at least two electrical contacts for engaging the prongs positioned in the housing, a magnetic current sensor defining an opening, wherein the magnetic current sensor opening is operatively coupled to an opening defined by at least one of the apertures wherein when one of the prongs is inserted through one of the apertures, the prong extends through the magnetic current sensor and engages at least one of the electrical contacts. In addition, the receptacle may include a power measurement device in electrical communication with the magnetic current sensor and the electrical contacts. Wherein when one of the prongs upon insertion into the receptacle and extension through the magnetic current sensor with engagement to the electrical contact induces a magnetic flux in the magnetic current sensor and the receptacle is configured to measure the magnetic flux and determine power consumption through the prong.

A further aspect of the present disclosure relates to a method of monitoring power consumption of an electrical receptacle configured to receive a plug having two or more prongs. The method may include supplying an electrical receptacle including a housing, the housing including a housing cover mounted on the housing including apertures for receiving at least one of the prongs. The housing may also include at least two electrical contacts for engaging the prongs positioned in the housing, a magnetic current sensor defining an opening, wherein the magnetic current sensor opening is operatively coupled to an opening defined by at least one of the apertures wherein when one of the prongs is inserted through one of the apertures, the prong extends through the magnetic current sensor and engages at least one of the electrical contacts. In addition, the method may include passing current through the prong and generating a magnetic flux and measuring a voltage and determining power consumption from the magnetic flux and said voltage.

Yet another aspect of the present disclosure relates to a system for monitoring power consumption of two or more receptacles over a network. The system may include a conductive pathway and one or more electrical receptacles in electrical communication with the conductive pathway each configured to receive one or more plugs having two or more prongs. Wherein the electrical receptacles may include a housing, a housing cover mounted on the housing including apertures for receiving at least one of the prongs, and at least two electrical contacts for engaging the prongs positioned in said housing. The electrical receptacles may also include a magnetic current sensor defining an opening, wherein the magnetic current sensor opening is operatively coupled to an opening defined by at least one of the apertures wherein when one of the prongs is inserted through one of the apertures, the prong extends through the magnetic current sensor and engages at least one of the electrical contacts.

BRIEF DESCRIPTION OF THE DRAWINGS

The above-mentioned and other features of this disclosure, and the manner of attaining them, will become more apparent and better understood by reference to the following description of embodiments described herein taken in conjunction with the accompanying drawings, wherein:

FIG. 11 is a schematic of an example of a system for supplying power to an appliance;

DETAILED DESCRIPTION

Figure 1:
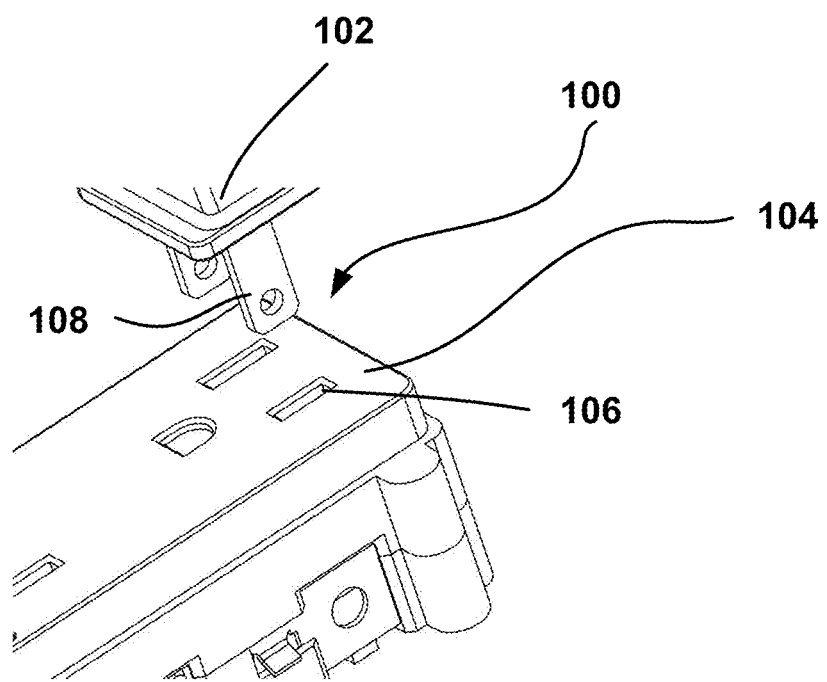
FIG. 1 illustrates a plug to be inserted into an outlet.
Figure 2:
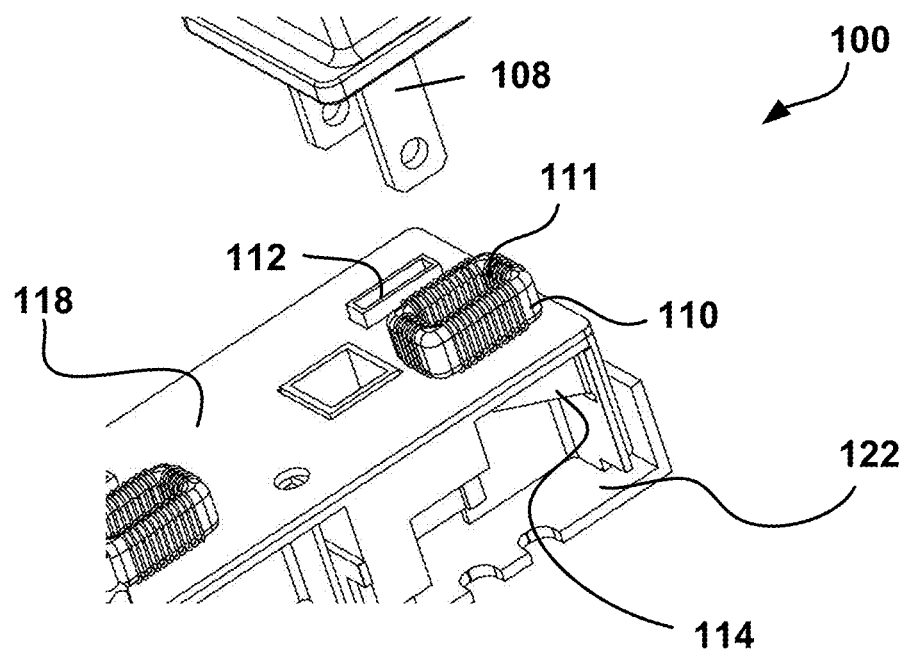
FIG. 2 illustrates a plug to be inserted into an outlet, wherein the front cover is removed.
Figure 3:
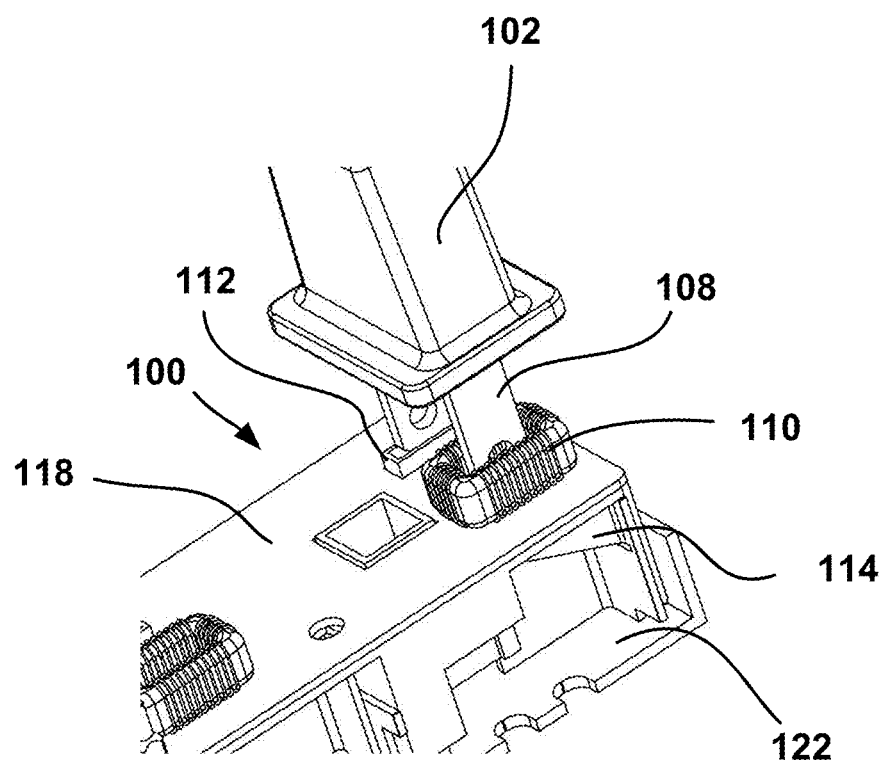
FIG. 3 illustrates a plug being inserted into an outlet through the center of the toroid.
Figure 4:
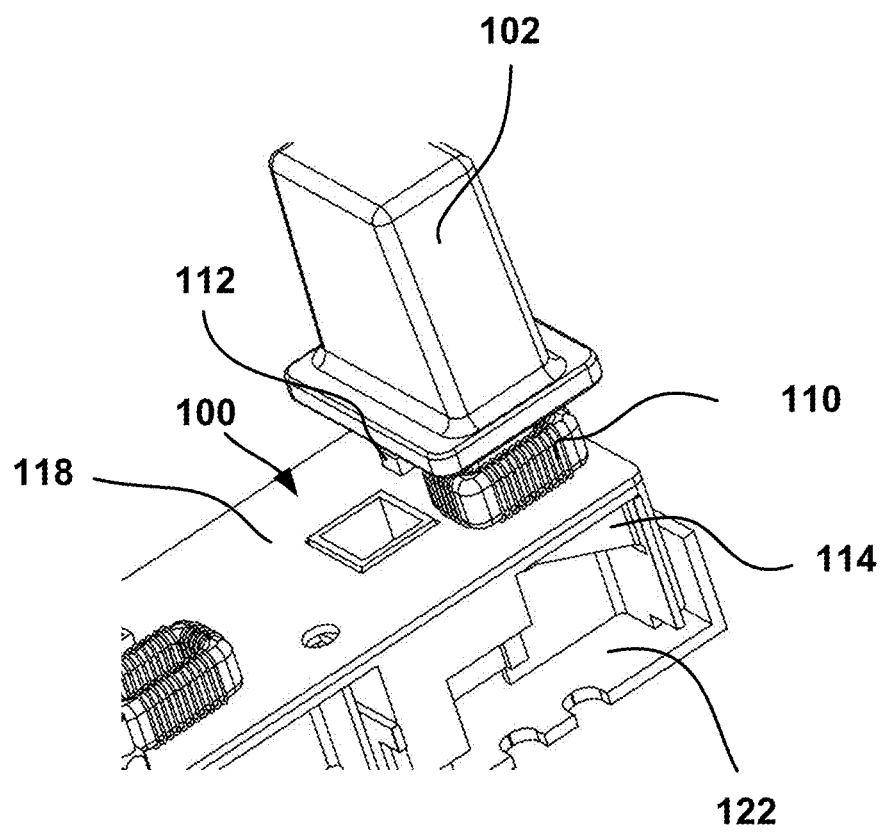
FIG. 4 illustrates a plug being fully inserted into an outlet.
Figure 5:
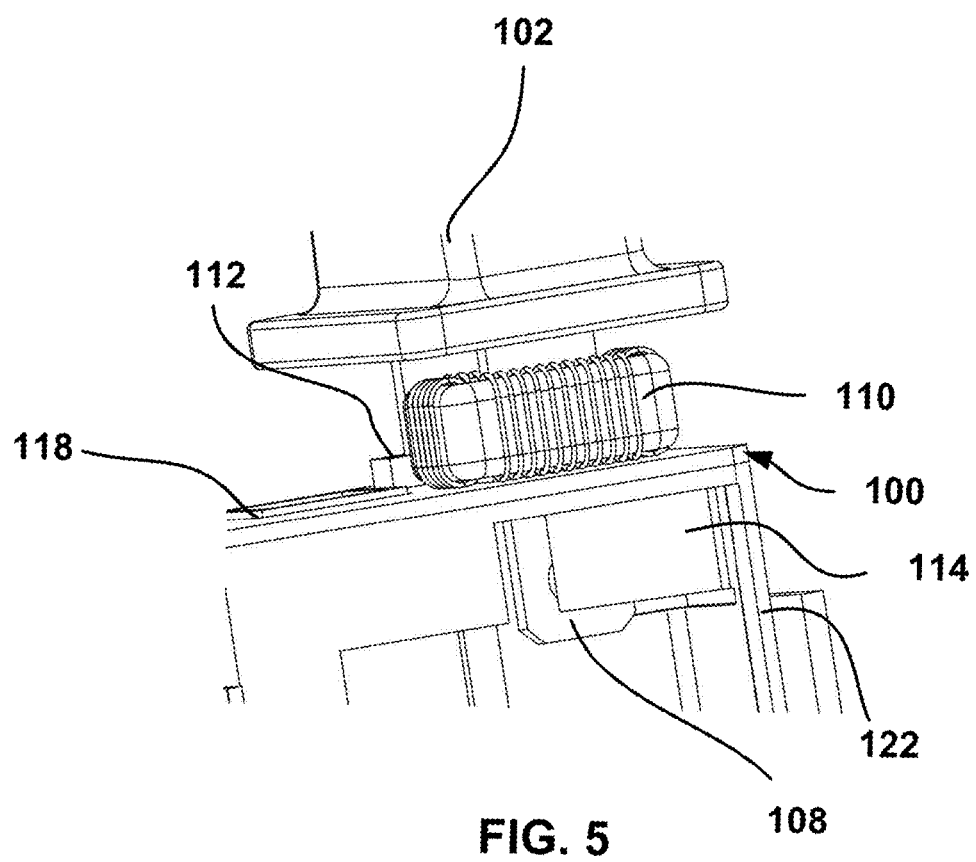
FIG. 5 illustrates the plug fully inserted through a toroid and contacting a live portion of the outlet.

It may be understood that this disclosure is not limited in its application to the details of construction and the arrangement of components set forth in the following description or illustrated in the drawings. The embodiments herein may be capable of other embodiments and of being practiced or of being carried out in various ways. Also, it may be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein may be used broadly and encompass direct and indirect connections, couplings, and mountings. In addition, the terms "connected" and "coupled" and variations thereof may not be restricted to physical or mechanical connections or couplings. Power or energy measurement may be understood as including information related to one or more of power, energy, Volt Amps reactive, voltage, current, harmonic decompositions of any of these, and the way that any of these vary over time.

As noted above, many power monitoring systems may utilize single point devices (i.e., devices that plug into a single outlet). One or more appliances (e.g. a refrigerator), creating a load or consuming power, may be plugged into the single point monitoring systems and the power draw of these devices may be determined. The single point devices may be rather cumbersome, requiring a readout unit to display power draw. Furthermore, the devices may protrude from an outlet in an unsightly manner, block other outlets, or require the use of extension cords to allow the single point power monitoring device to be read. Other power monitoring systems may monitor the power usage of an entire building, but do not monitor single power points. In addition, one may use a combination of such devices, which may become cumbersome to manage.

The present disclosure relates to monitoring devices that may allow for continuous monitoring of multiple points within an electrical system. In addition, a system may be provided wherein the monitoring devices may provide data over a communication network to a central point, such as a circuit box or a circuit panel. The data may then be communicated over an internal network or the internet or wirelessly to a data station within the building to analyze and monitor power consumption at individual nodes and over the overall system. Users may then see a complete picture of an entire power usage profile and adjust power usage accordingly, making intelligent, informed decisions as to how to change their power consumption.

In one example, power may be measured at a receptacle, wherein upon inserting a plug or other current carrying conductor into a receptacle, the plug prong may be passed through a magnetic current sensor such as a toroidal inductor. A magnetic current sensor may be understood as a sensor that changes its output, (e.g., current) in response to changes in magnetic field or flux generated by current passing through the sensor. The magnetic current sensor, in some examples, may be relatively cylindrical in shape, or assume a number of other shapes, such as that of a rectangle. Accordingly, a magnetic current sensor may not be limited to circular or annular geometries and can be constructed in a variety of ways. It may be appreciated that in some examples, the magnetic current sensor may define an opening therethrough, which may receive a conductor, such as a plug prong.

As alluded to above, in some examples the magnetic current sensor may include a toroidal inductor. A toroidal inductor may be understood herein as an electronic component, typically consisting of a circular ring-shaped magnetic core of iron powder, ferrite, or other material around which wire is coiled to make an inductor. The magnetic flux generated by a current passing though the center of a toroidal inductor may allow current sensing by the toroidal inductor while minimizing interference from outside influences. The toroidal inductor may be relatively cylindrical in shape, or assume a number of other shapes, such as that of a rectangle (i.e., a rectoid). Accordingly, toroidal inductors may not be limited to circular or annular geometries and can be constructed in a variety of ways. In general a toroid or toroidal inductor herein may refer to any closed magnetic path which encloses the path of the current to be measured. It may be appreciated that the closed path may assume any configuration, such as circular, triangle, rectangular, square, etc. This type of toroid or toroidal inductor may have a helix of wire wound around the magnetic path. In some examples, the toroidal inductor may be utilized as a Rogowski coil, which may be understood as a device for measuring alternating current or high speed current pulses.

Rogowski coils may consist of a shaped helical coil of wire with the inside of the helix describing a path encompassing the current to be measured. The path may contain a magnetic material to concentrate the magnetic flux, such as powdered iron or ferrite, or may be a non magnetic material, such as air or plastic. The coil may also be of an open form, and then be wrapped around a conductor carrying the current to be measured forming a closed magnetic path.

It may be appreciated that when a current is passed through the conductor, and hence, through the opening or closed magnetic path of the toroidal inductor, it may induce a magnetic field in the closed magnetic path. The magnitude of this magnetic field may relate to how much current is passing through the conductor. Using this method of current measurement may require a conductor to be "threaded" through the through-hole of a toroidal inductor. When the current in more than one conductor is to be measured, multiple toroidal inductors may be threaded.

In many applications, threading a conductor through a toroidal inductor may be complicated, requiring complex parts and/or assemblies. In the present application, wires and/or sheet metal or metal components may be threaded through the toroidal inductor to enable current measurement; however, these "threading" operations may make assembly difficult and may involve using multiple parts to make all of the needed connections.

The architecture of the system contemplated herein may utilize the action of an end user, during normal operation, to "thread" conductors through toroidal inductor. This may allow for reduction of part count and complexity. In some examples, as a user may insert a plug (i.e., conductor) into a receptacle, one or more prongs of the plug may pass through a toroidal inductor before making engaging the electrically connected portion of the receptacle. In this way the toroidal inductor may be threaded, by the action of the user.

For example, illustrated in FIG. 1, is an electrical receptacle 100 that may be provided into which a plug 102 may be inserted. The receptacle may include a front cover 104 including a number of openings 106 defined therein for receiving the prongs 108 of the plug. The front cover 104 may be mounted over a housing 122. FIGS. 2, 3, 4 and 5 illustrate the receptacle 100 with the front cover removed. As illustrated in FIGS. 2 through 5, a magnetic current sensor, (in this example, a toroidal inductor) 110 may be positioned on a housing cover 118, wherein the magnetic current sensor may assume the shape of a rectoid and define an opening 111. It may be appreciated that the magnetic current sensor may also be positioned underneath the housing cover, or substantially co-planer with the housing cover, however, it should be understood that the magnetic current sensor need not be the same thickness as the housing cover. In such a manner, the magnetic current sensor may be operatively coupled with an opening 113 defined in an aperture 112 in the housing cover 118. The housing cover 118 may be mounted on the housing 122. Also mounted within the housing may be a number of electrical contacts, including, for example, line contacts 114, neutral contacts and optionally grounding contacts. The prongs 108 of the plug 102 may pass through or be threaded through the opening of the magnetic current sensor 110, when the prongs 108 are inserted through the receptacle openings 106 and apertures 112. The plug prongs may then engage the electrical contacts, such as line contact 114. Line may be understood as the "hot" or "live" contact providing energy to the plug.

Figure 6:
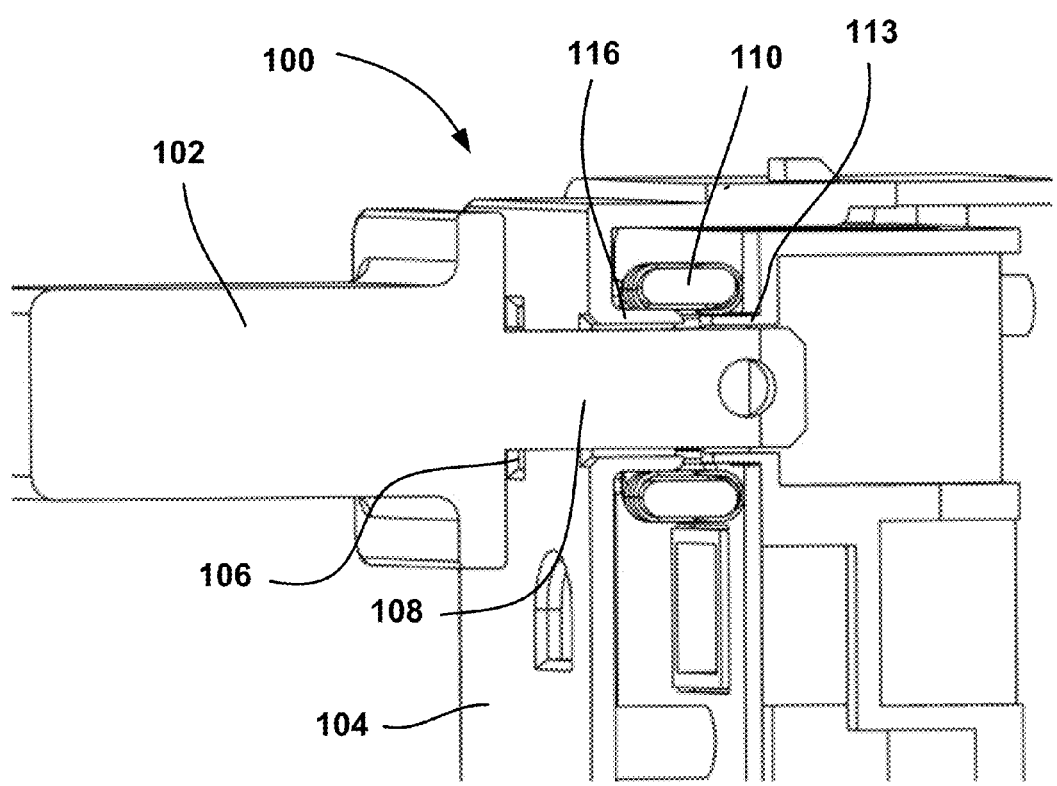
FIG. 6 illustrates an example wherein the housing of the outlet prevents the plug prongs from contacting the toroid.

In addition, as illustrated in FIG. 6, the prongs of the plug may be prevented from touching the magnetic current sensor by channels 116, forming the openings 106 in the front cover 104 or other housing/enclosure components. The channels 116 may be positioned or formed in the front cover 104 such that they are disposed between at least a portion of the plug 102 and a portion of the magnetic current sensor 110 when the plug 102 is inserted into the receptacle 100.

Figure 7:
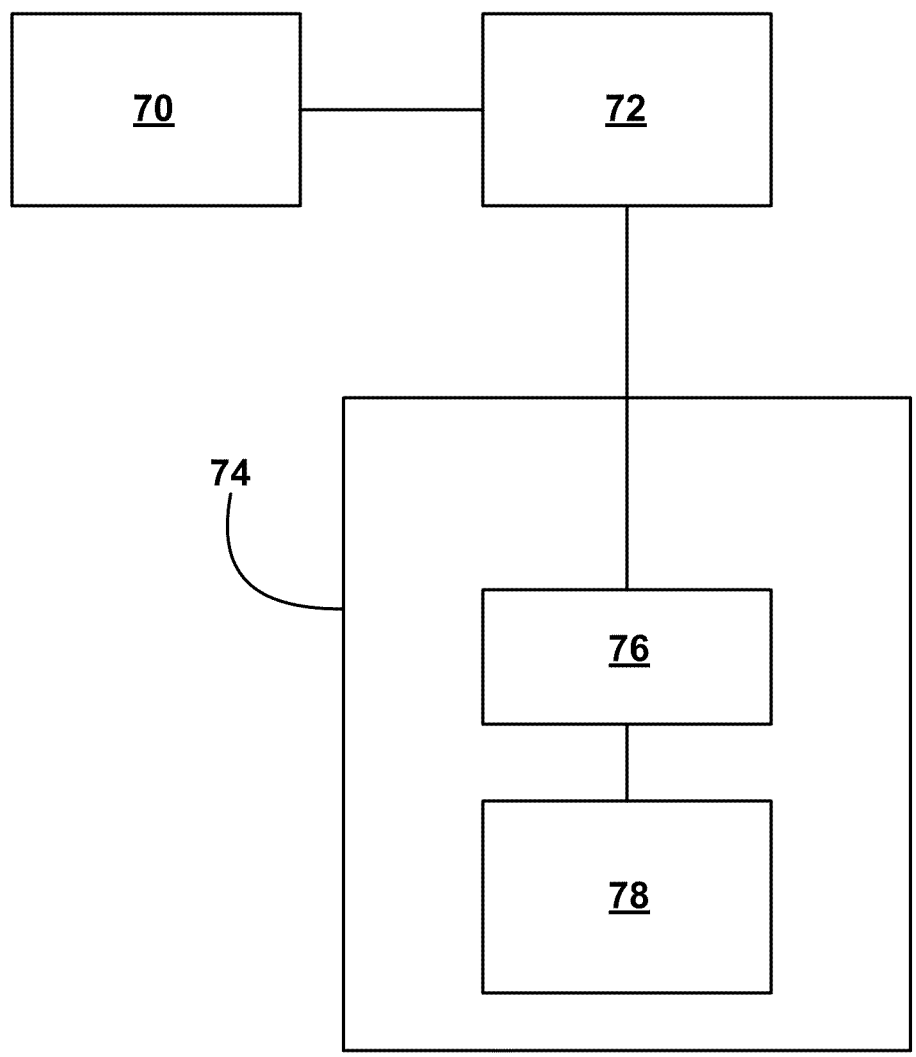
FIG. 7 illustrates a block diagram of an example of communication between a toroidal inductor, a network and a central point.

The magnetic current sensor may be connected to a measuring or recording instrument, such as a data acquisition system, which may then supply data to a processor and/or display data to the user. As illustrated in the example of FIG. 7, the magnetic current sensor 70 may be in electrical communication with a network 72 and supply measurement data through the network to a central point 74, such as a circuit panel. The data may be supplied as raw data or may be conditioned prior to communication of the data through the network. A data acquisition system 76, which may include components such as multiplexers, analog to digital converters, digital to analog converters, high speed timers and/or random access memory, etc. may receive the data supplied by the magnetic current sensor 70 and interface with a processor 78. It may be appreciated that, in some examples, communication between the magnetic current sensor and the data acquisition system or processor may occur at other locations over the network and furthermore, communication between the data acquisition system and processor may occur at various locations over a network as well. The measured data may then be processed and output as energy consumption, which may be measured over a given period of time or during a specified time period. Additional analysis functions may also be provided such as peak usage, cost associated with usage, etc.

Communication of information acquired from magnetic current sensor over a network may be facilitated by a node. "Nodes" may be understood herein as switches, outlets, breakers, connectors, junction boxes, lighting loads and many other hard wired devices or locations where electrical connections may be made, which may include electronics for communicating with the network system and/or monitoring power consumption conditions. The term "node" may also be applied to devices that are plugged into a circuit if they are so enabled with a means for communicating with the system. The node may be associated with other nodes in a circuit or with a given location in a building. Furthermore, the node may provide additional functionality, such as providing power to an outlet under specific conditions, e.g., all prongs being inserted simultaneously into an outlet, as described further herein.

Figure 8:
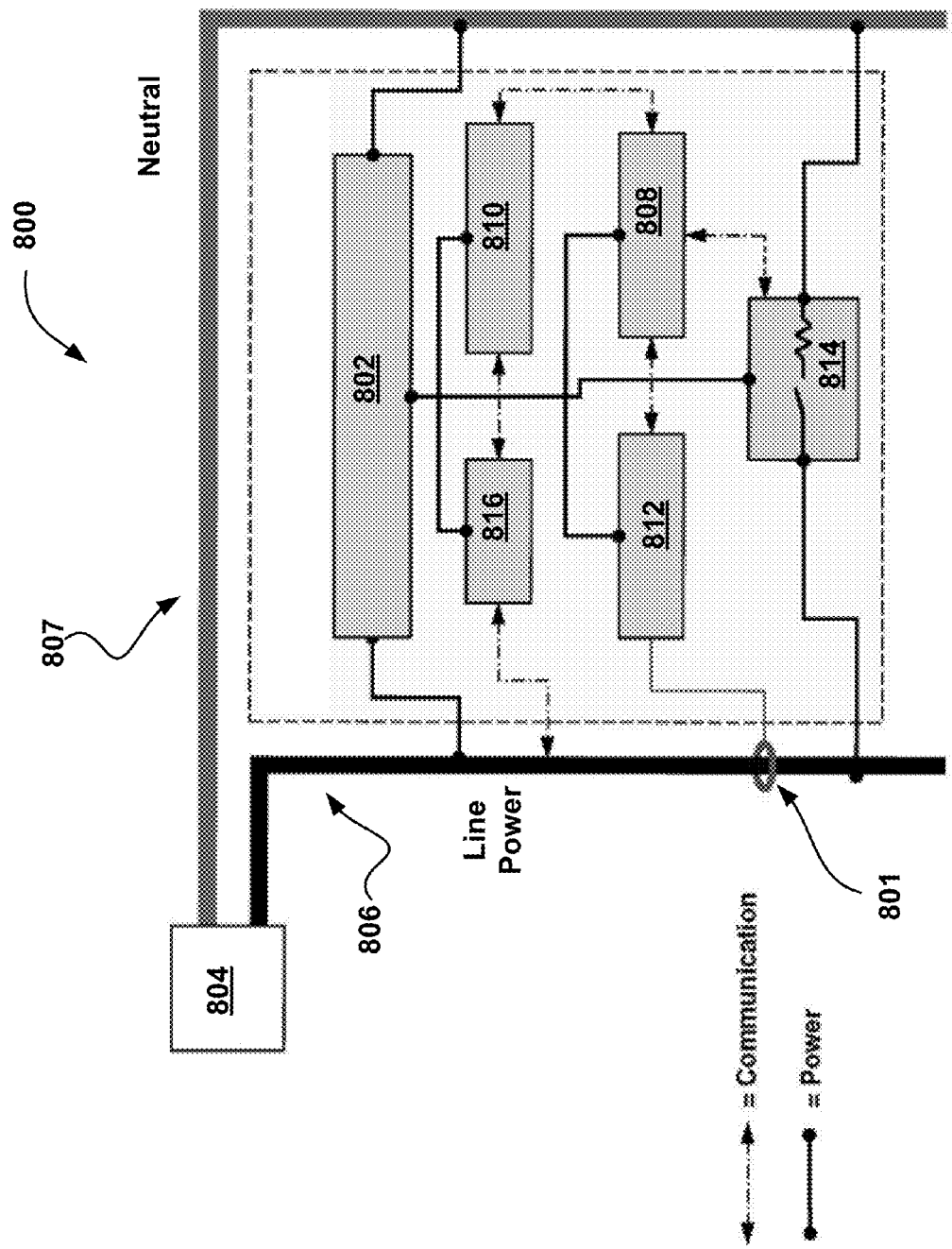
FIG. 8 is a schematic of an example of node electronics.

As illustrated in the example block diagram of node electronics of FIG. 8, a magnetic current sensor 801 may be provided as part of the electronics within the node 800. However, it may be appreciated that a magnetic current sensor may be provided separately from the node electronics. The node 800 may receive information regarding power consumption derived from measurements of the magnetic current sensor. Such information may relate to the magnitude of the current sensed by the magnetic current sensor. The control circuitry or node electronics may be utilized to provide signals related to the measurements made of the magnetic current sensor to other nodes or to a central processor, as illustrated in FIG. 7. In addition, the node electronics may perform other functions, such as mapping the node locations relative to one another as described below. The node may include a power supply 802, a microcontroller 808, a communications device 810, a power measurement device 812, a switchable microload 814 and a coupler 816, which enables communication to take place on the power lines.

The power supply may draw power from a power source 804 though power line 806 with a return path for the current, neutral line 807. The power supply may be a low voltage power supply (e.g. less than 30 volts), and may be configured to transform the power from AC to DC, and reduce the voltage to a level acceptable for the micro-controller, the switchable micro-load and communication device. In addition, the power supply may include a battery, which may be charged with energy available between line power 806 and neutral 807.

A micro-controller is illustrated at 808 for controlling the actions of the unit based on logic inputs. The micro-controller may also include arithmetic elements, as well as volatile and/or non-volatile memory. In addition, the micro-controller may include identifier information for identifying the node, such as a serial number stored in the controller.

A communications device 810 may also be provided. The communication device may be provided on the micro-controller as input and output interfaces. The communication device may create and receive node electronic signals including measurement signals which may be interpreted by the various electronics within the node, other nodes or in a central processor with which the node may communicate. Signals received by the node may be filtered from and to the power line by a coupler 816. The coupler 816 may allow for one or more communication signals to be sent over the power line 806 and may utilize existing communication standards.

A power measurement device 812 which may measure key aspects of power (current, voltage, phase . . . etc.), may also be integrated into the micro-controller, or communicate therewith. The power measurement device may be facilitated by measuring the magnetic field generated by the current through the toroidal inductor 801, and by the measurement of voltage between two or more of the points in the circuit Other power measurement devices may also be incorporated within the node, including Hall effect sensors, etc.

A switchable "micro-load" 814 may also be included. The switchable "micro-load" may create a directional and detectable electrical event. The micro-load may be activated when directed by the microcontroller, such as during system functions. The powered micro-controller may direct the switchable micro-load to trigger, creating a detectable signal for upstream nodes—i.e. those nodes required to transmit power from the source. It may be appreciated that a node may include one or more devices described above, (e.g., a power measurement device, a switchable "micro-load", a microprocessor, etc.), depending on the application.

Accordingly, it may also be appreciated that the node may provide a means of electrical communication between the magnetic current sensor and a network. In addition, in some examples, the node electronics may be utilized to condition the raw data provided by the magnetic current sensor before communicating the data over the network. For example, the measurement data may be received by the measurement device 812 as an analog signal and then converted to digital signals via an analog to digital converter and/or provided to the micro-controller for manipulation.

Figure 9:
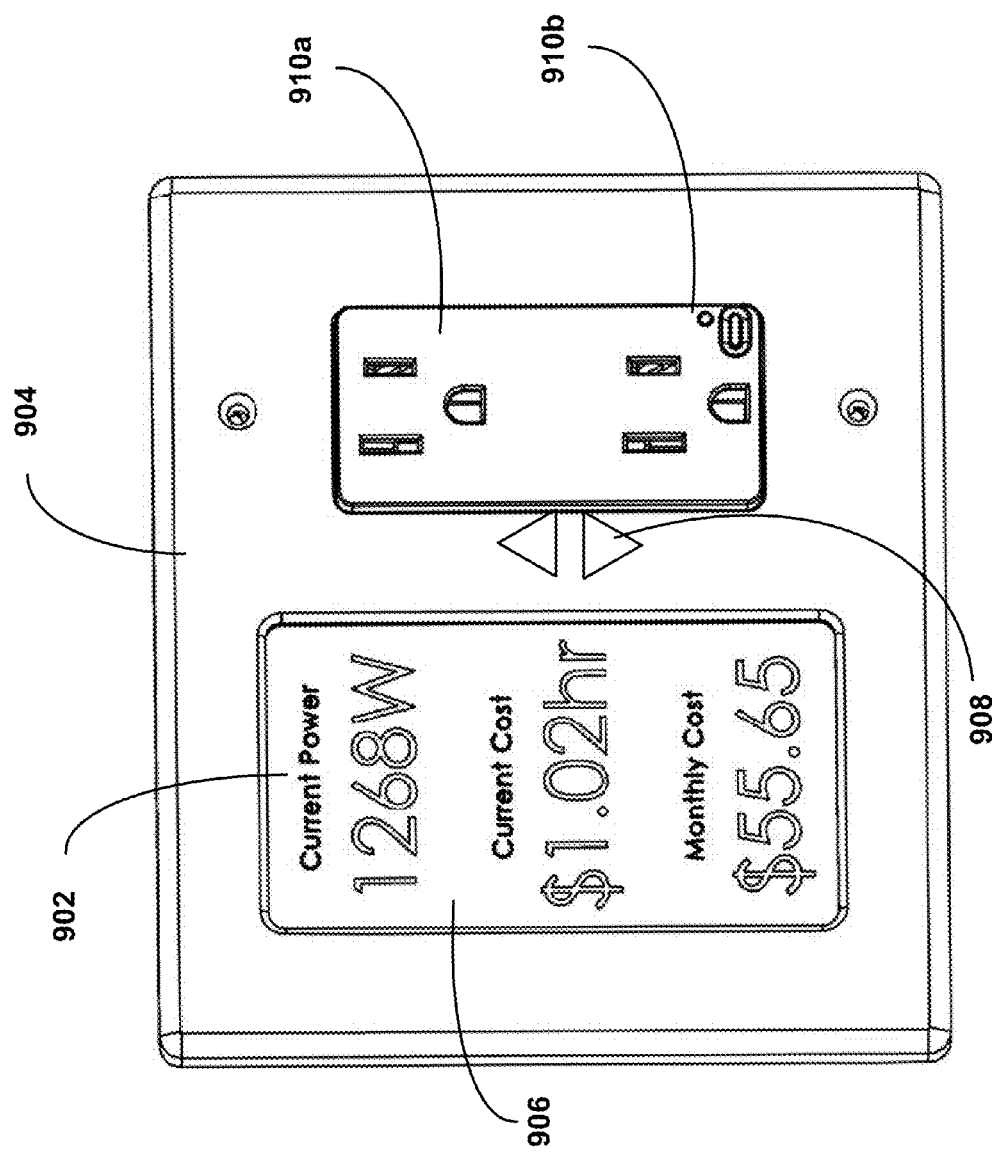
FIG. 9 is an example of an appliance including a display that may display power consumption information relating to a given outlet and provided by a toroidal inductor within the outlet.

It may be appreciated that in some embodiments, the node may display the power usage at the outlet. Accordingly, the node electronics may also include a display feature. The display feature may be provided in an appliance which may be mounted, powered and/or in communication with the node. An appliance may be defined as a device with electronics that has one or more useful functions. An appliances may be embedded or incorporated into a outlet wallplate, switch wallplate or junction box cover . . . etc., and the appliance may include a means for drawing power from the nodes and communicating with or through the nodes. It is important to note that appliances do not interfere with the normal function of a node—the apertures of an receptacle remain open for plugs, switches continue to function and junction boxes continue to transmit power, etc. FIG. 9 illustrates an example of an appliance 902 integrated into an outlet wall plate 904 providing a display 906, which in this case informs a user of information related to the power consumption of each outlet 910*a* and 910*b*, etc. This information may include energy used, current, voltage, reactive volt amps, harmonic content etc. In addition, functional controls 908 may be provided for use of the appliance, including toggle keys and selection buttons. It may be appreciated that the appliances may include additional functionality such as emergency lighting, night lights, environmental monitors, air quality monitors, alarms, sensors, intercoms, sound monitors, security devices, including cameras, battery backup, displays and information portals, among many others.

Figure 10A:
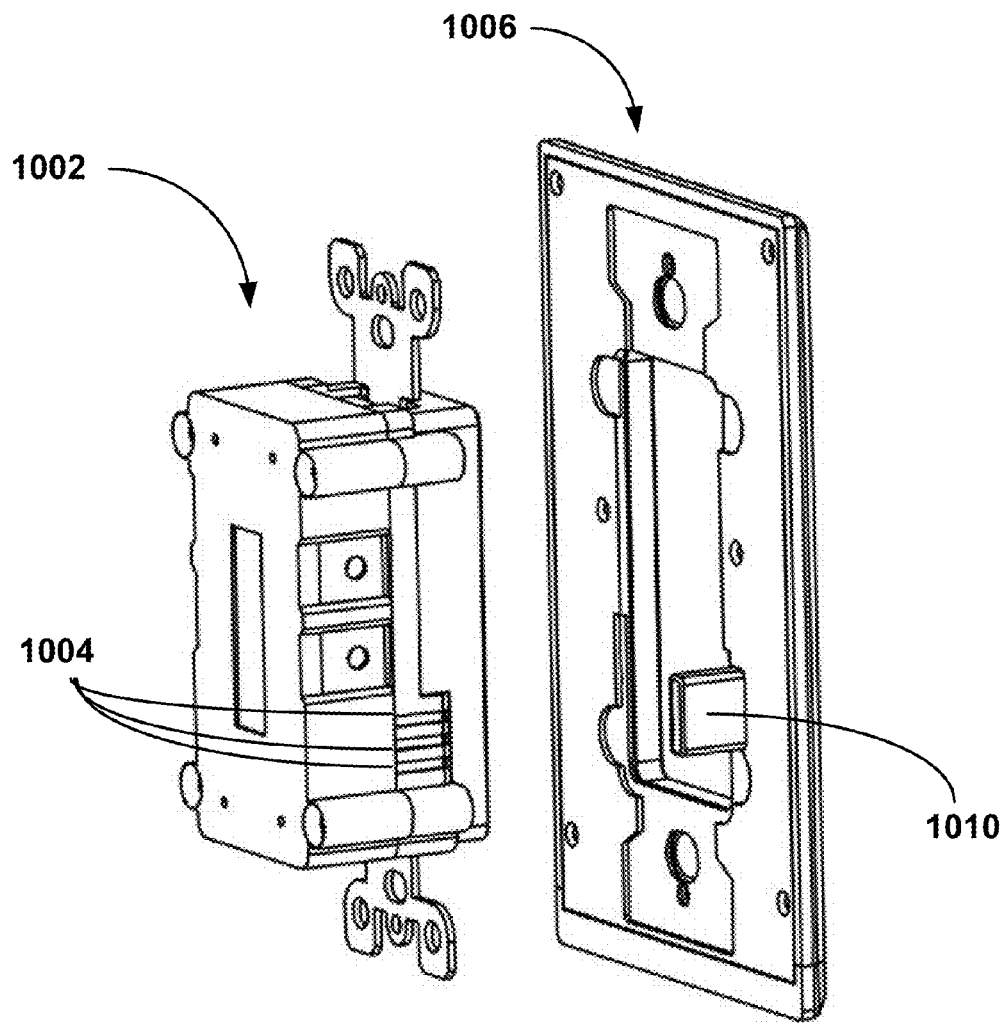
FIG. 10a is an example of an outlet including contacts for engaging a set of contacts on an appliance.
Figure 10B:
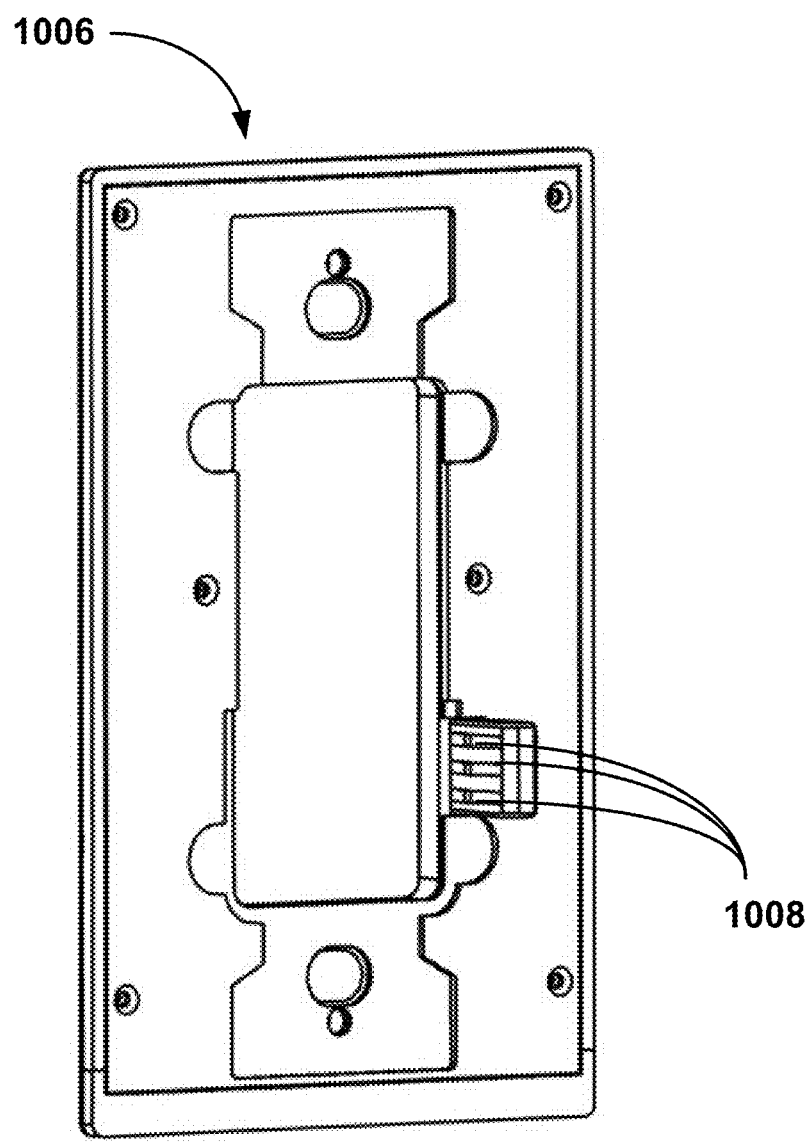
FIG. 10b is an example of an appliance including contacts for engaging a set of contacts on an outlet.

An appliance may receive power from a node by an interface between the wall plate and the node, as illustrated in FIG. 10*a*. The node 1002, in this example, an outlet, may be provided with power from a power distribution center through a breaker further described herein. The outlet 1002 includes a number of contacts 1004, three as illustrated. The wall plate 1006 may also include a number of contacts 1008 (illustrated in FIG. 10*b*) on a finger or tab 1010, which may engage the contacts 1004 on the outlet 1002. The contacts may provide power and/or communication to the wall plate 1006, having an appliance embedded therein. Communication to and from these appliances may take place through wireless and/or wired means, including using the node network wiring. Accordingly, the appliances may be controlled or monitored in a number of locations, such as at an interface on the appliance itself, or as described above, over the internet, ethernet, powerline or other points of accessibility.

In one example, power may be provided to an appliance through an outlet, switch or other receptacle through the node electronics. Each node may be capable of providing a certain amount of low voltage power, including ≤30 volts and all values or increments between 0 and 30 volts, and a certain amount of communication bandwidth. Bandwidth may be understood as the amount of data that may be passed through a communications channel in a given period of time. If an appliance can operate within the limits of the node power level and communication bandwidth, it may use the node for both power and communication, significantly simplifying the components required for the appliance to function. FIG. 11 illustrates an exemplary schematic of power distribution to an appliance 1102. As noted above, the power may be provided through the node electronics 1104 in an outlet 1106. The outlet 1106 may receive power from an electrical distribution system 1108, such as a circuit panel.

Figure 12:
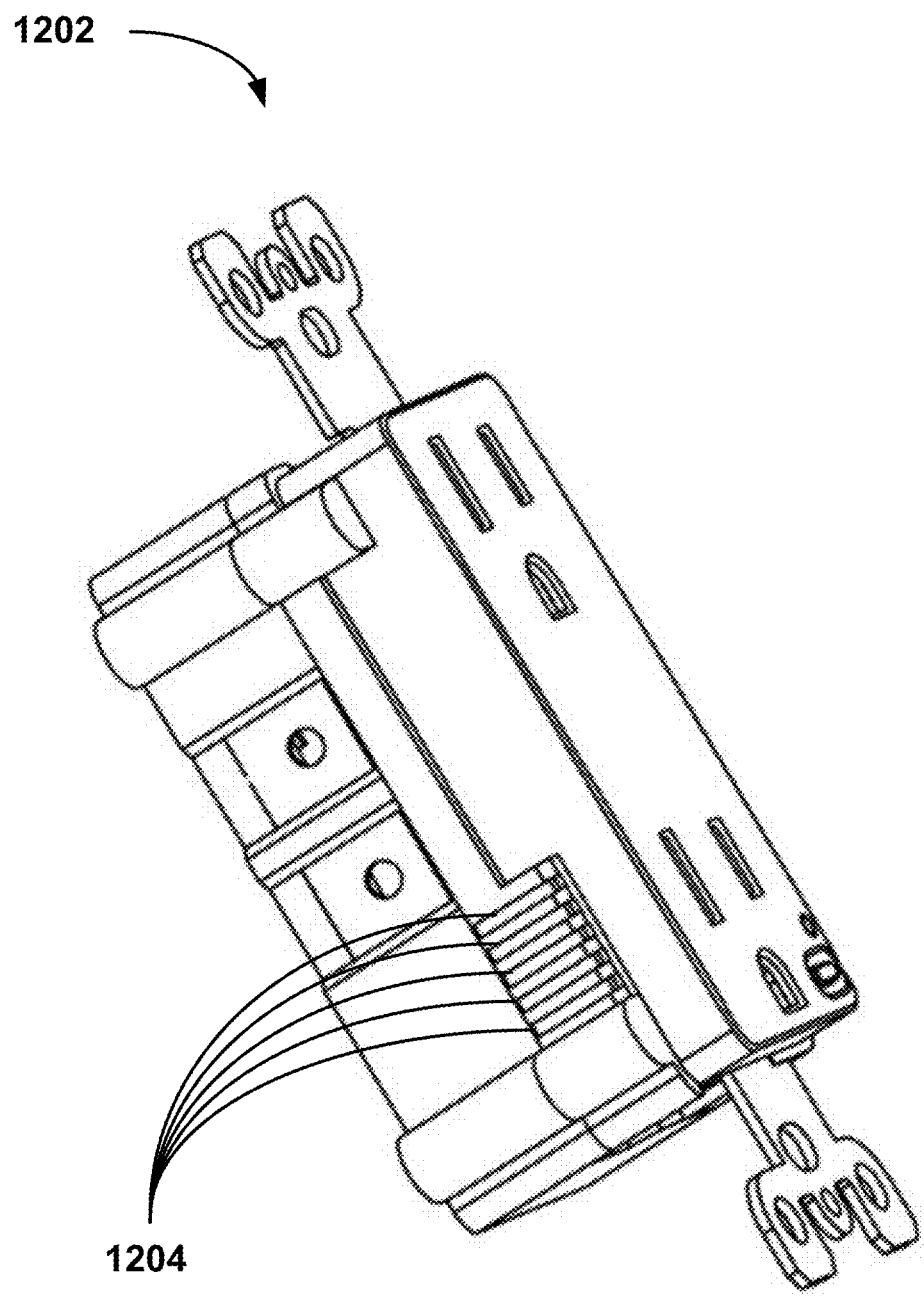
FIG. 12 is an illustration of an outlet including contacts for engaging a set of contacts on an appliance.
Figure 13:
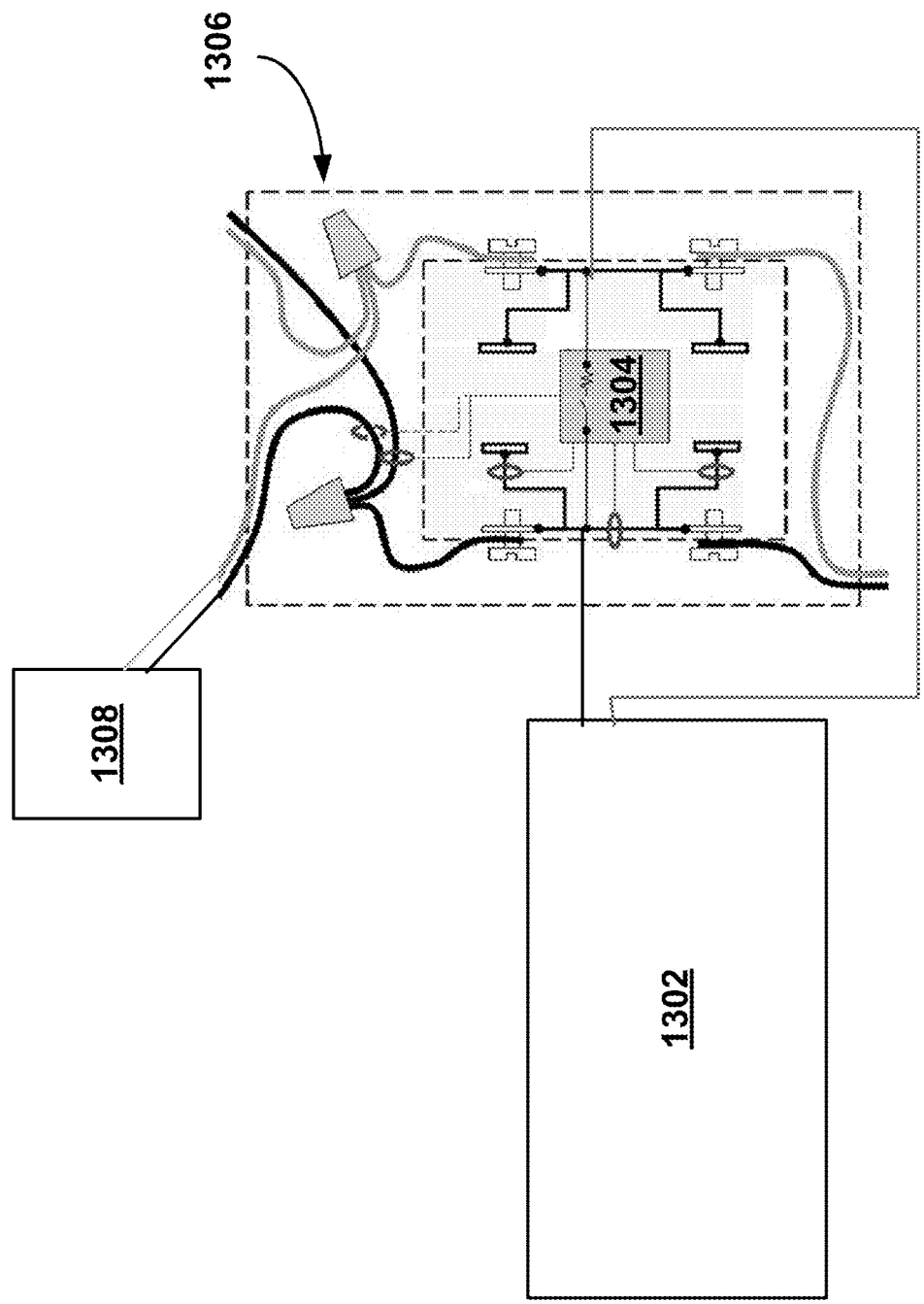
FIG. 13 is a schematic of an example of a system for supplying power to an appliance.

For appliances which need either more power or greater communication bandwidth, the nodes may be configured to enable an appliance to draw power from and communicate over the power network without the limitations imposed by the node. In other words, while the wall plate may still provide an interface between the appliance and the node, e.g. the outlet, the power is not provided through the power supply of the node electronics. These contacts may provide the voltage and power generally available on the node network (e.g. 110 volts) and/or an independent communication pathway. The node electronics may still transmit power to these contacts and/or have the ability to interact with the power provided from such contacts, for instance limiting current, switching power on or off, monitoring power . . . etc. FIG. 12 illustrates such a node 1202 including more than the above referenced 3 contact points, e.g. 5 contact points 1204 that allow for an additional two contacts to supply power of greater than 30 volts and bandwidth greater than that which may be available in the node electronics. Depending on a particular appliance's need, it may have its own power supply and/or communication system and use the node primarily as an interface. FIG. 13 illustrates an exemplary schematic diagram wherein power is provided to an appliance 1302 through a node, e.g. an outlet, 1306, bypassing the power supply of the node electronics 1304. It is also envisioned that in any of the previous scenarios, that the communication and power could be achieved through means other than physical contacts, for instance, through inductive coupling. It is also envisioned that a power and communication connection could be established with a node through appliance contacts that may be configured to make an electrical connection with standard outlet or switch screw type lugs or flying leads from the appliance to the screw type lugs. In this fashion, appliances can achieve power and communication with existing switch and outlet designs that may or may not have the electronics capabilities and electrical contacts described herein.

In addition to the above, the node electronics may also include a number of other functions. For example, the electronics may include a temperature sensor (or other environmental sensors). The node may display such information via the appliance described above. Furthermore, the electronics may also provide user-detectable signals, such as audio or optical signals for alerting a user to the physical location of the node. The node may also include a means for a user to convey information to it, for example a button. When said button is operated by a user it may cause a communication to be sent identifying the node to which this operation occurred. This may provide another means of correlating a node's physical location with respect to an electronic representation of the system wiring.

Commonly a number of nodes, including outlets may be provided throughout an electrical system. Accordingly, also contemplated herein is a method of system and method for mapping a wired network containing nodes which may be configured to identify themselves to a central processor or identify themselves with respect to one other due to their own distributed processing capability. The connection of the nodes may then be determined with respect to other nodes from which an electrical wiring diagram may be generated, pinpointing the location of the toroidal inductors. For example, a central processor (e.g. a computer), which may coordinate and collect node communications and information, may be connected or integrated into a breaker panel or any location within any given building, or even positioned at a remote location. A visual display may then be provided to analyze/review the electrical system, including the electrical wiring diagram, usage for given circuits or rooms, and/or usage for specific nodes. Furthermore, any aspect of this information regarding the electrical system may be forwarded to a remote location and accessed, e.g., over the Internet or any desired information network.

Figure 14:
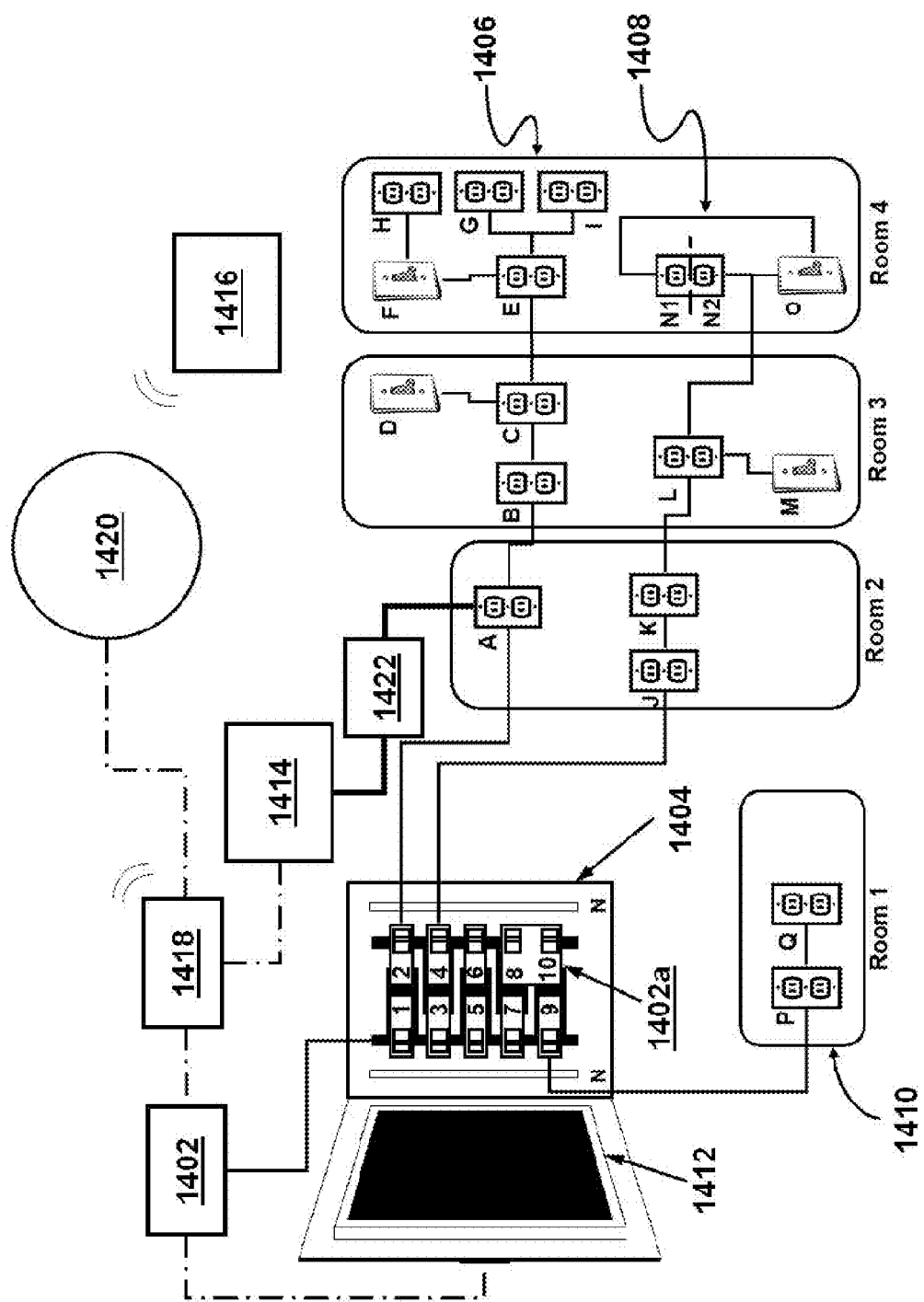
FIG. 14 illustrates is a schematic illustration of an exemplary system contemplated herein.

FIG. 14 illustrates an example of an electrical system wherein three circuits 1406, 108, 110, may contain a variety of switches and outlets (i.e., nodes) which may provide routing of power throughout a building. For example, breaker #2 provides power to outlets A, B, C, E, H, G and I, and also to switches D and F. It may be understood that electrical devices and loads within a building are electrically wired in one or more circuits. A circuit may be understood as a path for the flow of current, which may be closed. Circuits may also be wired in "parallel." When wired in "parallel," disconnecting one device will not prevent the others from working. However, it may be appreciated that some devices may be wired in "series," wherein the devices may be dependent on other devices to provide power through an electrical connection in the device itself. In other words, disconnecting an upstream device will disable downstream devices. For example, on breaker #2, power to outlets E, G, I, H and switch F in Room 4 may be dependent on outlets A, B and C, i.e. if any of these are disconnected, outlets E, G, I, H and switch F in Room 4 may not have power since each of outlets A, B and C use an electrical bus in their housings to provide power to the next outlet. However, outlets G and I are not dependent on one another and both may maintain power if the other is disconnected.

Furthermore, it may be appreciated that the nodes may be connected to a common bus, or conductive pathway, i.e., the circuits, which may form the network (72 referring to FIG. 7) described herein. As understood herein, a common bus may be understood as providing electrical continuity between at least one connection on each of the nodes. Furthermore, it may be appreciated that one or more additional common busses may be provided for the nodes.

Upon direction from processor 1402, which may be prompted by a user action into the interface 1412, each of the nodes included in the outlets, switches, etc., may be configured to create and detect a node electrical signal. The signal may be a directional and detectable electrical signal that may be utilized to map the nodes. That is, a node's location in a virtual electrical wiring diagram may be determined by creating a detectable signal at the node, which can be relayed to identify its position to a user in such a diagram. The directional electrical event may be understood as an electrical signal that may be detected differently by upstream nodes as compared to downstream nodes. Upstream nodes may be wired electrically in the path of flowing current proximal to the primary power source relative to other nodes. Downstream nodes may be wired electrically in the path of flowing current distal to the primary power source relative to other nodes. For example for node E, nodes A, B, C and #2 (breaker) may be considered upstream nodes, and nodes F, G, H and I may be considered downstream nodes.

Depending on the signal method used, node D may or may not be considered an upstream node. For example, if the signal is generated by node E by creating an incremental electrical load, node D does not detect the flow of power. If the signal generated by node E is a voltage signal, node D may see the signal and be considered upstream. The algorithm for creating a map of the network (see below) can take into account what kind of signaling method is utilized. An incremental load may be understood as a current draw, in addition to those otherwise present in the circuit, with a sufficiently high source impedance that may have a relatively minimal effect upon the voltage on the wiring; such a signal may be at a lower frequency. A voltage signal may be understood as a power source with a sufficiently low source impedance that it is detectable as a change in voltage on the wiring; such a signal may be at a relatively higher frequency.

Each node may have a set of other nodes that are upstream and downstream from it. An accumulated table of information about which nodes are upstream and downstream from other nodes may then allow for the creation of an electrical wiring diagram. Some nodes may share the same set of upstream and/or downstream nodes, because they are electrically equivalent, for example, in FIG. 14, nodes G and I. The processor, such as central computer 102 may coordinate the sequence of directional events at each node, collect information regarding which nodes detect electrical events of other nodes, and develop a wiring diagram. The processor may also collect information regarding power usage and other data at each node and may compile the data for transmission through wireless or wired means for local viewing and interaction, e.g., interface 1412, another computer 1414 connected to the system, or a mobile computer 1416, which may wirelessly communicate with a router 1418 in either direct or indirect (as illustrated) communication with the system, or transmission to a remote location 1420, such as over the internet. This information may also be retrieved directly through the power network through an appropriate interface 1422.

In an illustrative embodiment, a directional electrical event may be created by a switched known load at each node. By using the power monitoring devices within each node, and by measuring the power that flows through each node, each upstream node may detect the load of a downstream node and a wiring diagram may be created. This process may be done in the presence of other loads, i.e. the switched load may be incremental to existing loads. A further enhancement includes a node having a remote current sensor (e.g. tethered) for measuring current that flows through an electrical or junction box but not through the device itself (described further herein). Using remote current sensors, outlets that would otherwise be electrical "equivalents" may be physically ordered in the wiring diagram (e.g., all nodes are wired using a pig-tail configuration and do not carry power to other nodes using an internal bus, further discussed below).

Figure 15:
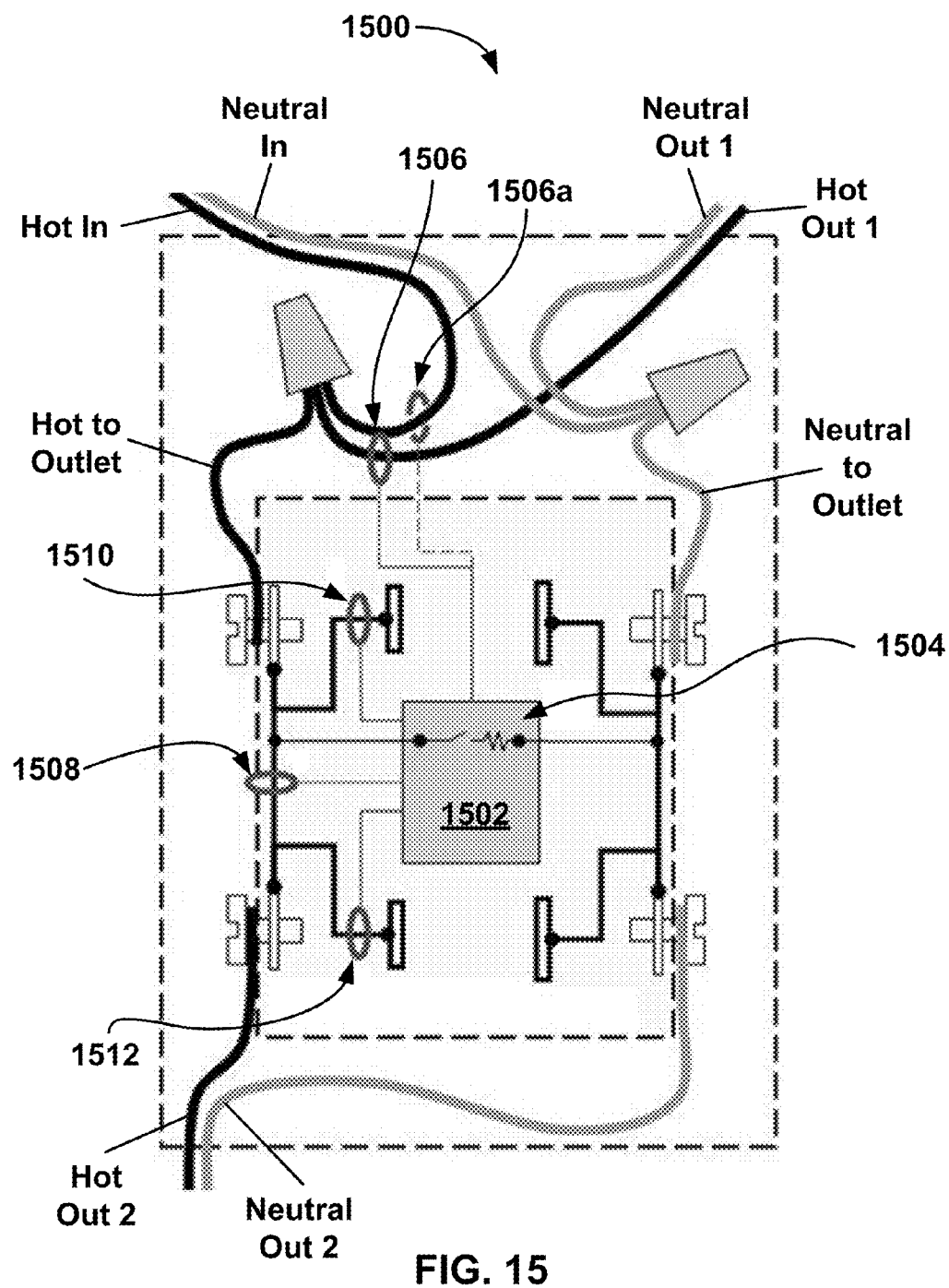
FIG. 15 is a schematic diagram of a duplex outlet receptacle and an example of node electronics for the receptacle.

The node wiring and electronics may be configured based on the node type. For example, FIG. 15 is a diagram of an exemplary outlet node 1500 (which represents a duplex socket) and associated wiring. The outlet may include power provided through a "hot wire" via the "Hot In" wire and to the individual sockets via wire "Hot to Outlet." Power may also pass through the outlet via "Hot Out 1" and "Hot Out 2." In addition, a neutral may be provided to the outlet "Neutral In" as well as through the outlet and out of the outlet, "Neutral Out 1" and "Neutral Out 2," respectively. The electronics 1502 may include a switchable micro-load 1504. Current sensor 1508 may enable measurement of the power flowing through the node, a feature which may enable mapping, and current sensors 1510 and 1512, which may include toroidal inductors positioned in the sockets as described above and illustrated in FIGS. 1-6, may measure power drawn from their respective sockets. In addition, external current sensors, 1506 and 1506a, may be provided, either of which may monitor power passing through the electrical box that does not pass through the node itself. Accordingly, it may be appreciated that the current passing through the node, being drawn from the node and flowing around the node may all be measured. These sensors may allow for a better understanding of the physical location of nodes with respect to one another. In situations where the two sockets of a duplex receptacle are wired separately, a single set of node electronics may be used for both monitoring and mapping each receptacle independently.

Figure 16:
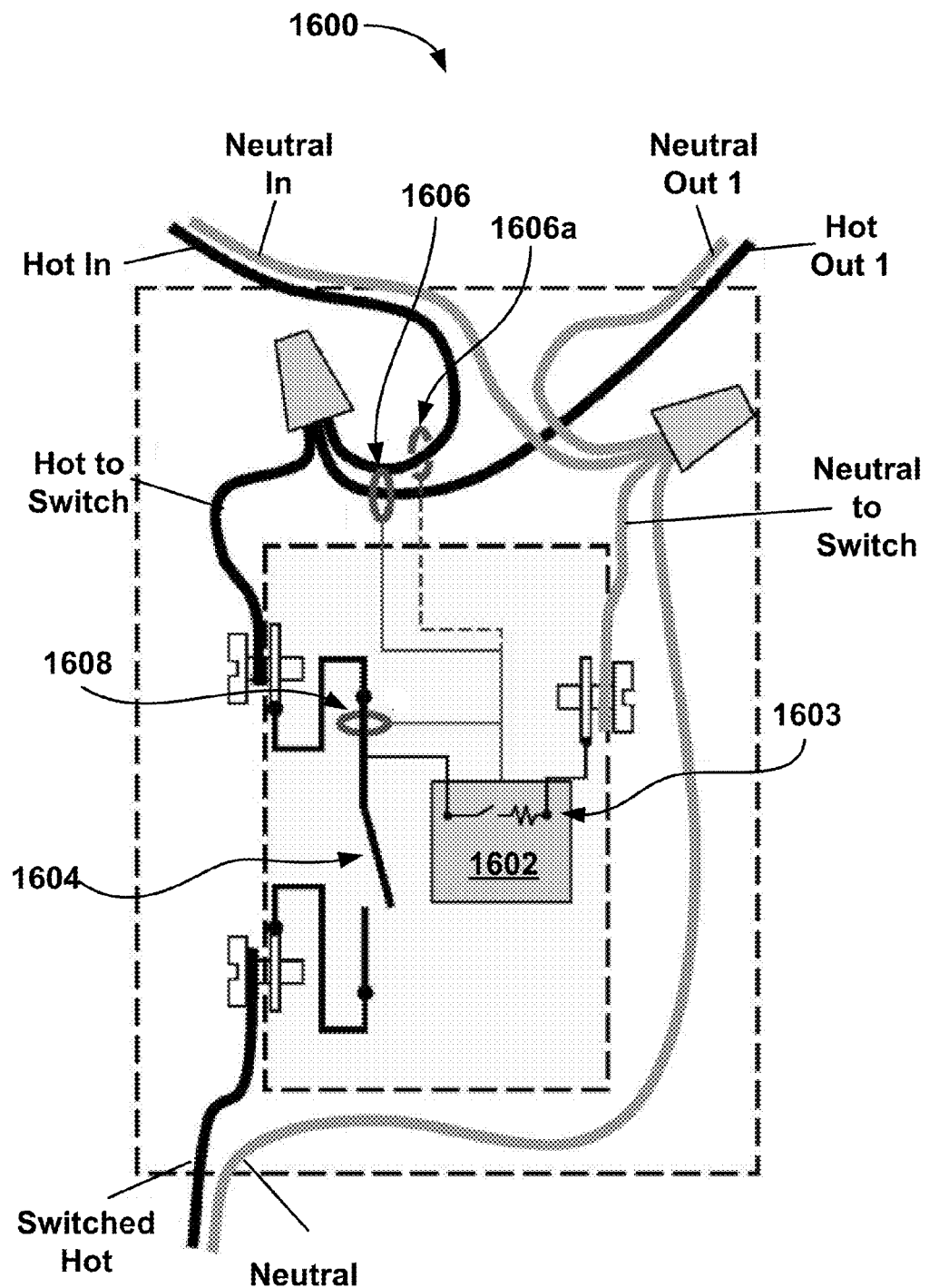
FIG. 16 is a schematic diagram of node electronics in a two-way switch.

FIG. 16 is a diagram of an exemplary 2-way switch node 1600 and its associated wiring, i.e., "Hot In," "Hot Out," "Hot to Switch," "Switched Hot," as well as "Neutral In," "Neutral Out," "Neutral to Switch," etc. As seen, the electronics 1602 may include a switchable micro-load 1603 for the switch 1604. Current sensor 1608 may enable measurement of the power drawn through the switch. The electronics may also include external sensors 1606 and 1606a, which may monitor power which runs through the electrical box, but not the node, allowing for a better understanding of the physical location of nodes with respect to one another. Note that the switch may include a neutral connection, which allows the system electronics to be powered for its various activities. Other schemes for drawing power without the neutral connection are contemplated. For example a current transformer may be used, which may pull power from a single wire when the switch is closed and under load. This power may be used to drive the node electronics and/or recharge a battery to power the node electronics for periods when power is not flowing. In addition, a small amount of power may be drawn from line voltage and returned to ground, in such a fashion and amount that it does not present any danger to people or property (and also so that any GFI in the circuit does not unintentionally trip). This configuration may be used to charge a battery, which in turn may drive the electronics.

In another example, power may be drawn in series with the load, allowing a relatively small current to flow through the node when it is notionally off, in a configuration similar to existing lighted switches. Power drawn by this method might be used to power the node electronics and/or charge a battery to power the node electronics in conditions that do not allow for power to be provided.

Figure 17:
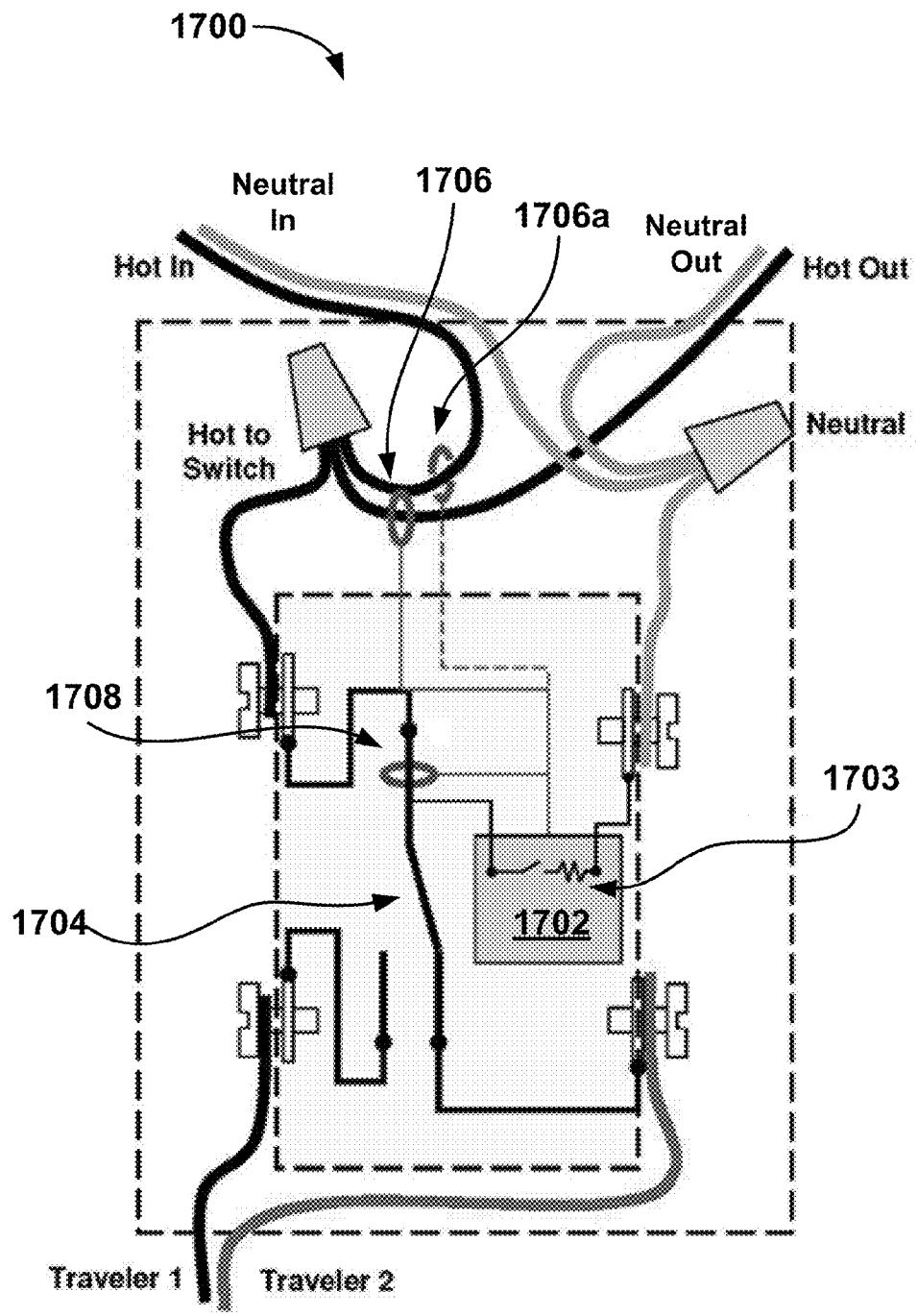
FIG. 17 is a schematic diagram of node electronics in a three-way switch.

FIG. 17 is a diagram of an exemplary 3-way switch, wherein some of the characteristics are consistent to those described with respect to FIG. 16. More specifically, the electronics 1702 may include a switchable micro-load 1703 for the switch. Current sensor 1708 may measure the power drawn from the switch. The electronics may also include external sensors 1706 and 1706a for monitoring power which runs through the box but not the node, allowing for a better understanding of the physical location of nodes with respect to one another. Once again, the switch may include a neutral connection, which may allow the system electronics to be powered for its various activities. Similar methods for powering a 2-way switch in the absence of a neutral may also be applied for a 3-way switch.

Figure 18:
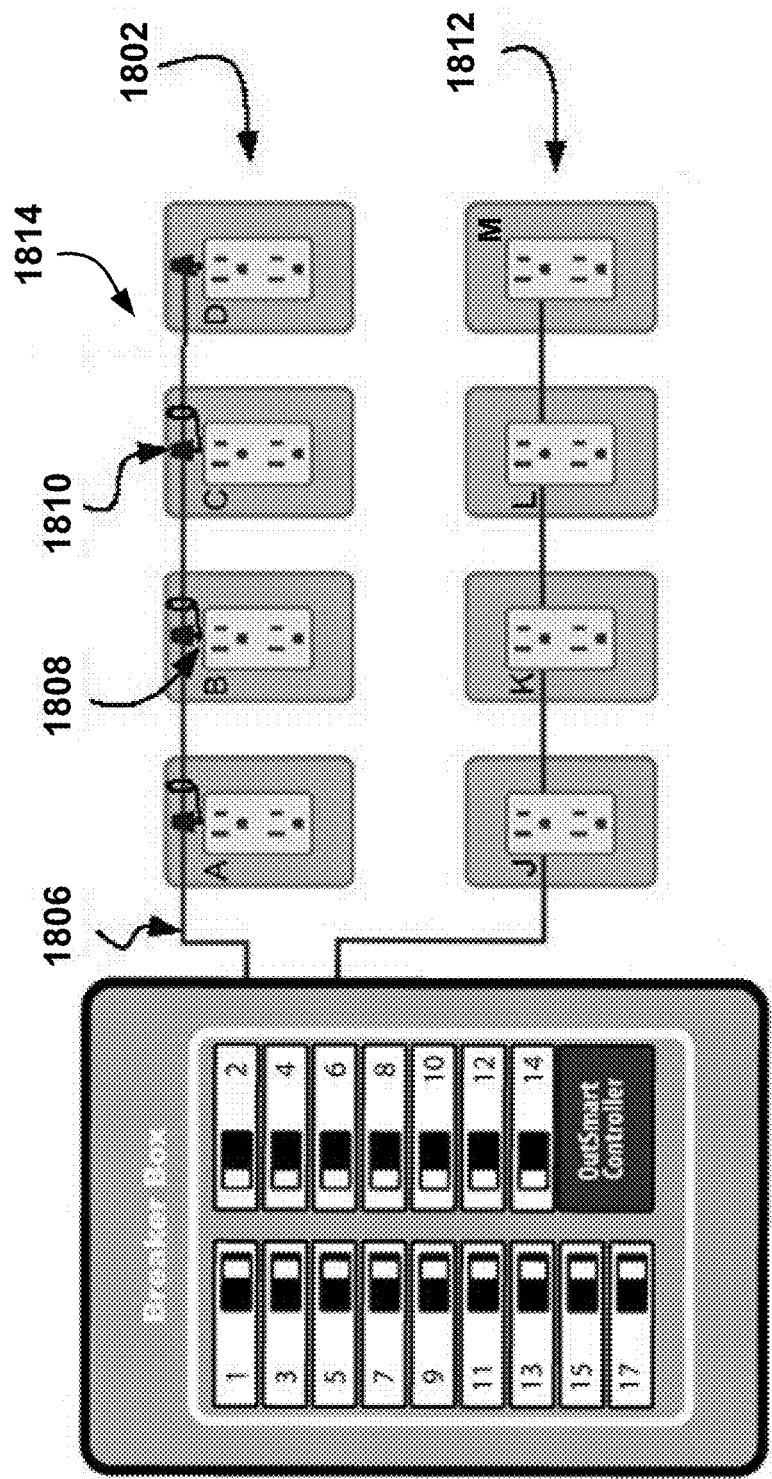
FIG. 18 is a schematic diagram of nodes wired in "parallel" versus nodes wired in "series."

FIG. 18 shows the difference between what is termed a "pig-tail" (or parallel) configuration 1802, and a "through" or series configuration 1812. In a "pig-tail" configuration power may be brought into an electrical or junction box A-D from a main line 1806 and a short wire 1808 is connected to the incoming wire and the outgoing wire (through twist on wire connector 1810, for example) to power a nodes A-D. This means that if any outlet/node is disconnected, power may continue to be provided to other nodes. This may be in contrast to through wiring 1812, where a conductive pathway within node J may be responsible for powering subsequent nodes K, L and M, (i.e. disconnecting power to node J will remove power from nodes K, L and M). In the pigtail configuration, external sensors (e.g. 1814) may be employed, which may indicate that A was wired before B, which was before C, which was before D. It should therefore be understood herein that node A is considered to be electrically upstream of, for example nodes B, C and D. For outlets J through K, the current sensor within the node may determine the order of the outlets relative to one another. Electrical junction boxes may also be configured with suitable electronics, so the monitoring and mapping information may be done by the box, which would then effectively be a node.

Figure 19:
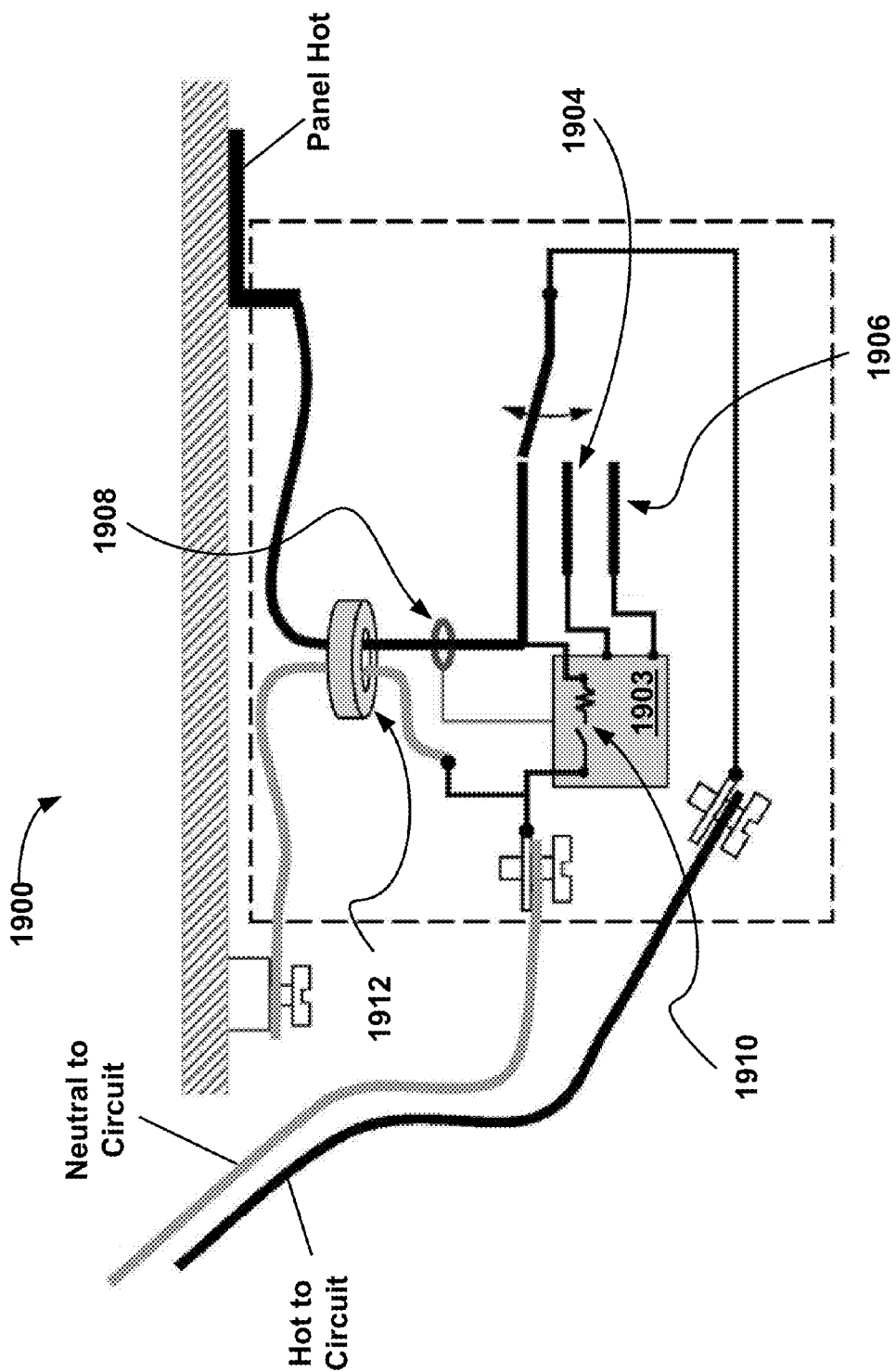
FIG. 19 is a schematic diagram of node electronics for use in a breaker.

FIG. 19 is a diagram of an exemplary circuit breaker including system electronics 1903. The breaker may receive power from the circuit panel through a "hot" wire "Panel Hot." The breaker may provide power to a circuit "Hot to Circuit" and a neutral "Neutral to Circuit." Like other nodes, it may apply a switchable load 1910 which may allow itself to be identified in the network. The circuit breaker node may also include a sensor 1908 to enable power measurement through the breaker. Like other breakers, it may have the ability to switch off in the case of an over-current, ground fault and/or arc-fault condition or other conditions which may be deemed unsafe. For example, the breaker may include a GFI sensor and/or other electronics 1912. However, when the breaker trips and removes power, it may continue to provide communication with its circuit and the rest of the system. The individual nodes on the circuit may be self-powered including batteries, capacitor or super-capacitor, etc., so that they may communicate information to the breaker during a fault condition. The circuit may then report to the breaker and then to the processor (central or distributed) what may have caused the fault and what actions should be taken before turning the circuit back on. Among many possibilities, these actions may include unplugging a load (appliance) or calling an electrician.

In one embodiment, the breaker may switch to a communications channel 1904 where nodes, running on residual power (provided by a battery or capacitor, etc.) may communicate their status. In another exemplary embodiment, the breaker may connect to a power limited channel 1906 (low voltage and/or current) to continue to provide small amounts of power to the circuit for communication. This power could be applied as a low voltage supply between line and neutral or a low voltage supply between line and ground, at a level that does not present a danger, and assuring the power draw does not cause any GFI in the circuit to trip. The breaker may be configured to enter either a communications or low power mode via a remote command to interrogate the system and identify problems. Alternatively, the nodes may be able to communicate important information about the events leading to a fault condition before the breaker trips.

It may be appreciated from the above, that also contemplated herein is a mechanism for nodes to communicate their state to the system. State may be understood as the current condition of a node and/or its adjustable parameters; e.g. whether a switch is on or off, whether power is being drawn from the node and in some cases, the extent of the power being drawn from the node. For instance, if a light switch, such as those referred to in FIGS. 16 and 17 did not have a neutral connection, but was powered through some other device (e.g. inductive or battery), when turned on it would announce itself to the system and its state (of being on) and the system could detect that a load appeared through the switch and other upstream nodes, thereby establishing the switch's position in the network. Effectively, the load may serve as the detectable directional event for the switch. Additionally, if a switch is turned on and communicates its state to the system, and no load or outlet is seen beyond the switch, one may construe some type of problem—e.g. a bulb has failed. Similarly, if the load associated with a switch changes over time, one or more of many light bulbs may have failed. A controlled or switchable outlet could function in much the same manner described, communicating its state to the system. A dimmer switch, for example, could communicate the level at which it has been set.

Figure 20:
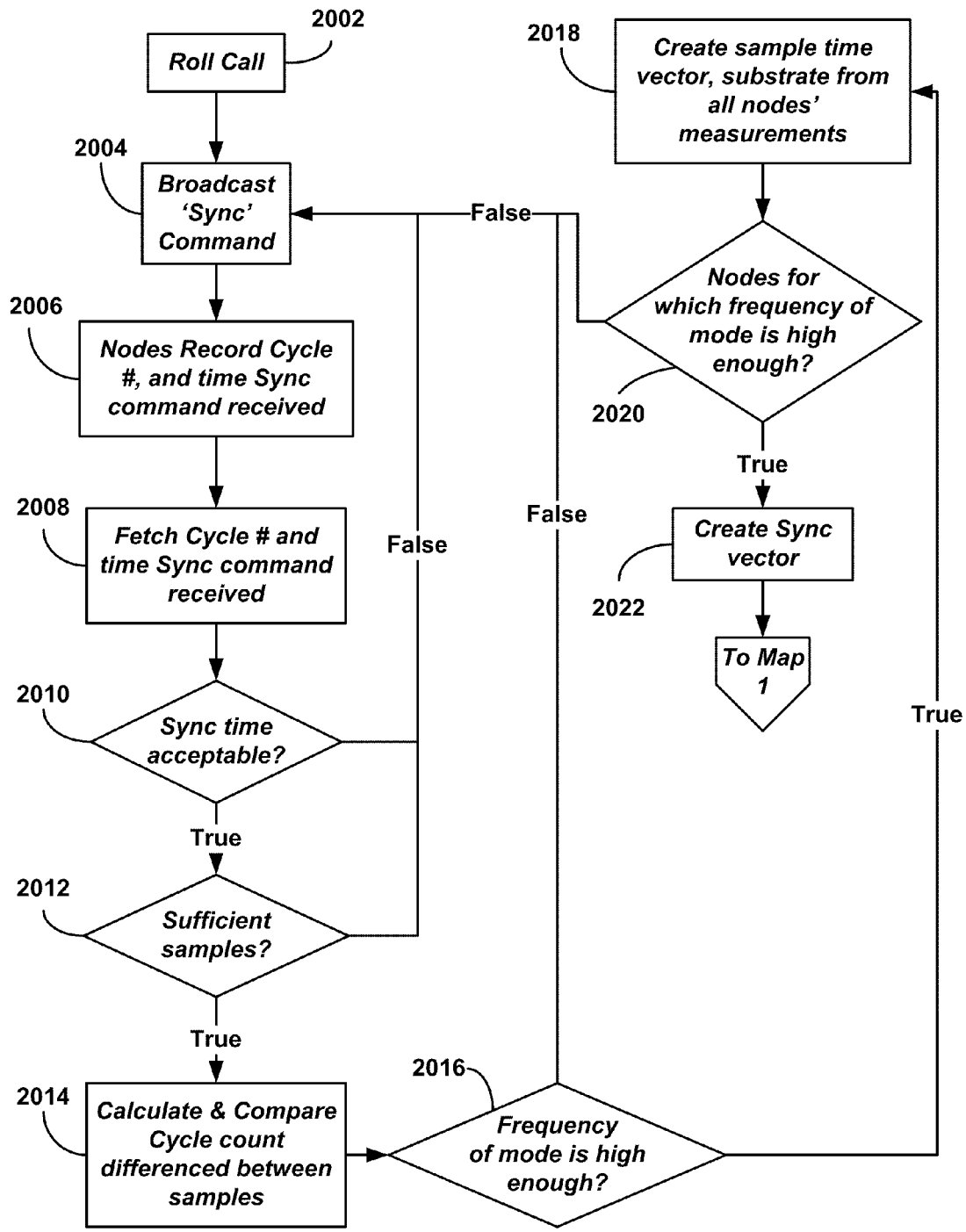
FIG. 20 is an example of a method of synchronizing.

As alluded to above and also contemplated herein is a method for mapping the various nodes and monitoring power usage and other information via communication between the nodes and the processor. The process of mapping the nodes may begin with the individual nodes or the central processor. For example, when a node is powered or reset, or the central processor sends a reset signal as illustrated in FIG. 20 a roll call may be initiated at 2002. Each active node may wait a random period of time and send a message to the processor indicating that it is present. An active node may be understood as a node currently capable of communicating with a processor. Inactive nodes may be understood as nodes currently unable to communicate with a processor (e.g. because they are isolated by a switch which is turned off or are powered only in the presence of a load . . . etc.) and may or may not be accounted for by the processor, depending on whether the node was (previously known to exist and deemed) likely to reappear at some later point in time. When each active node sends a message to the processor that it is present, the message may include descriptive information, such as, identifying information, e.g., a serial number, or the type of node it may be, e.g., switch, breaker, outlet, appliance, etc. The processor may create a list of all the active nodes present on the network at that time, including any descriptive information sent to the processor. In addition, the nodes may include a line cycle counter that may be started when the node is powered up or reset.

Once the system is aware of the active nodes which may be present in the system, the system may synchronize the nodes. The processor may broadcast a 'Sync' command to all nodes at 2004. In one exemplary embodiment, each node may maintain a line cycle counter, which may increment on the positive going zero crossing of the line voltage waveform. Upon receipt of the sync command, the node may save a copy of the counter as C, and the time since the last increment, i.e., on the last or previous positive going rising edge of the line voltage wave form as R at 2006. The node may then provide the values of C and R to the processor upon request, such as a Fetch Cycle at 2008. If R is reported as being too close to the zero crossing time for a significant number of nodes, then sync times may be found to be unacceptable and the set of measurements may be rejected at 2010.

The 'Sync" operation may be performed a number of times until sufficient samples are collected, as decided at 2012. For a given number of nodes n and a given number of samples q, the values of C collected may be saved as an array according to the following:

$$C[m][p],$$

wherein m is an index of the node (from 1 to n), and p is an index of the sample set (from 1 to q). It may be appreciated that the data might contain some errors. The following table includes an exemplary dataset for purposes of illustration, wherein n=5 and q=6, as follows:

| C[m][p] | Time Sample p | | | | | |
|---|---|---|---|---|---|---|
| Node m | 1 | 2 | 3 | 4 | 5 | 6 |
| 1 | 773 | 1157 | 1260 | 1507 | 1755 | 1846 |
| 2 | 719 | 1102 | 1205 | 1452 | 1699 | 1791 |
| 3 | 773 | 1157 | 1259 | 1507 | 1754 | 1846 |
| 4 | 598 | 984 | 1085 | 1332 | 1579 | 1671 |
| 5 | 530 | 914 | 1017 | 1263 | 1511 | 1602 |

From the array, a set of differences may be calculated at 2014 according to the following equation:

$$\Delta C[m][p]=C[m][p]-C[m][p-1]$$

For example, based upon the same data the following results may be obtained:

| $\Delta C[m][p]$ | Time Sample differences p | | | | |
|---|---|---|---|---|---|
| Node m | 2-1 | 3-2 | 4-3 | 5-4 | 6-5 |
| 1 | 384 | 103 | 247 | 248 | 91 |
| 2 | 383 | 103 | 247 | 247 | 92 |
| 3 | 384 | 102 | 248 | 247 | 92 |
| 4 | 386 | 101 | 247 | 247 | 92 |
| 5 | 384 | 103 | 246 | 248 | 91 |

The mode (most common value) for all m may then be calculated at 2016 for each value of p according to the following equation:

$$\Delta T[p] = \text{mode of } \Delta C[m][p]$$

across all values of m, for each value of p. For example, based upon the same data, the following may be observed:

| ΔT[p] | Time Sample difference p | | | | |
|---|---|---|---|---|---|
| | 2-1 | 3-2 | 4-3 | 5-4 | 6-5 |
| Sample Vector | 384 | 103 | 247 | 247 | 92 |

The series may be summed, where T[1] may be assumed to be 0, using the following equation:

$$T[p] = \Delta T[p] + T[p-1] \text{ for } p \text{ from 2 to } q.$$

For example, based upon the same data:

| T[p] | Time Sample p | | | | | |
|---|---|---|---|---|---|---|
| | 1 | 2 | 3 | 4 | 5 | 6 |
| Vector | 0 | 384 | 487 | 734 | 981 | 1073 |

If the mode does not represent a large enough proportion of the nodes at 2016 for any sample then the sample may be rejected from T and a more sync commands may be sent. Where the mode represents a sufficient portion of the nodes at 2016, another set of differences may be calculated at 2018, wherein $$\Delta D[m][p] = C[m][p] - T[p].$$

For example, based upon the same data:

| ΔD[m][p] | Time Sample p | | | | | |
|---|---|---|---|---|---|---|
| ZNode m | 1 | 2 | 3 | 4 | 5 | 6 |
| 1 | 773 | 773 | 773 | 773 | 774 | 773 |
| 2 | 719 | 718 | 718 | 718 | 718 | 718 |
| 3 | 773 | 773 | 772 | 773 | 773 | 773 |
| 4 | 598 | 598 | 598 | 598 | 598 | 598 |
| 5 | 530 | 530 | 530 | 529 | 530 | 529 |

The mode for all p may be calculated at 2020 from each value of m, according to the following equation:

$$D[m] = \text{mode of } \Delta D[m][p]$$

across all values of p, for each value of m, wherein D[m] represents the relative cycle value for the nodes internal line cycle counters. For example, based upon the same data:

| D[m] Node m | Sync Vector |
|---|---|
| 1 | 773 |
| 2 | 718 |
| 3 | 773 |
| 4 | 598 |
| 5 | 530 |

Showing that, for example, for node 1, line cycle 773 refers to the same interval of time as line cycle 530 for node 5.

If the mode for any node did not represent a large enough proportion of the samples at 2020, then the node may still be considered unsynchronized, and the operation may be repeated to synchronize any such nodes to the other already synchronized nodes. If the mode did represent a large enough portion of the samples at 2020, then as above, a table of sync offsets may be generated for each node at 2022. It may be appreciated that in repeating the procedure, a synchronized node does not become an unsynchronized node.

After the system is synchronized, the process of mapping the nodes relative to one another can take place. The first practical step in mapping the electrical network is to assign nodes to breakers. Although it is feasible to map the network without using this approach, assigning nodes to breakers first may be more efficient.

Figure 21:
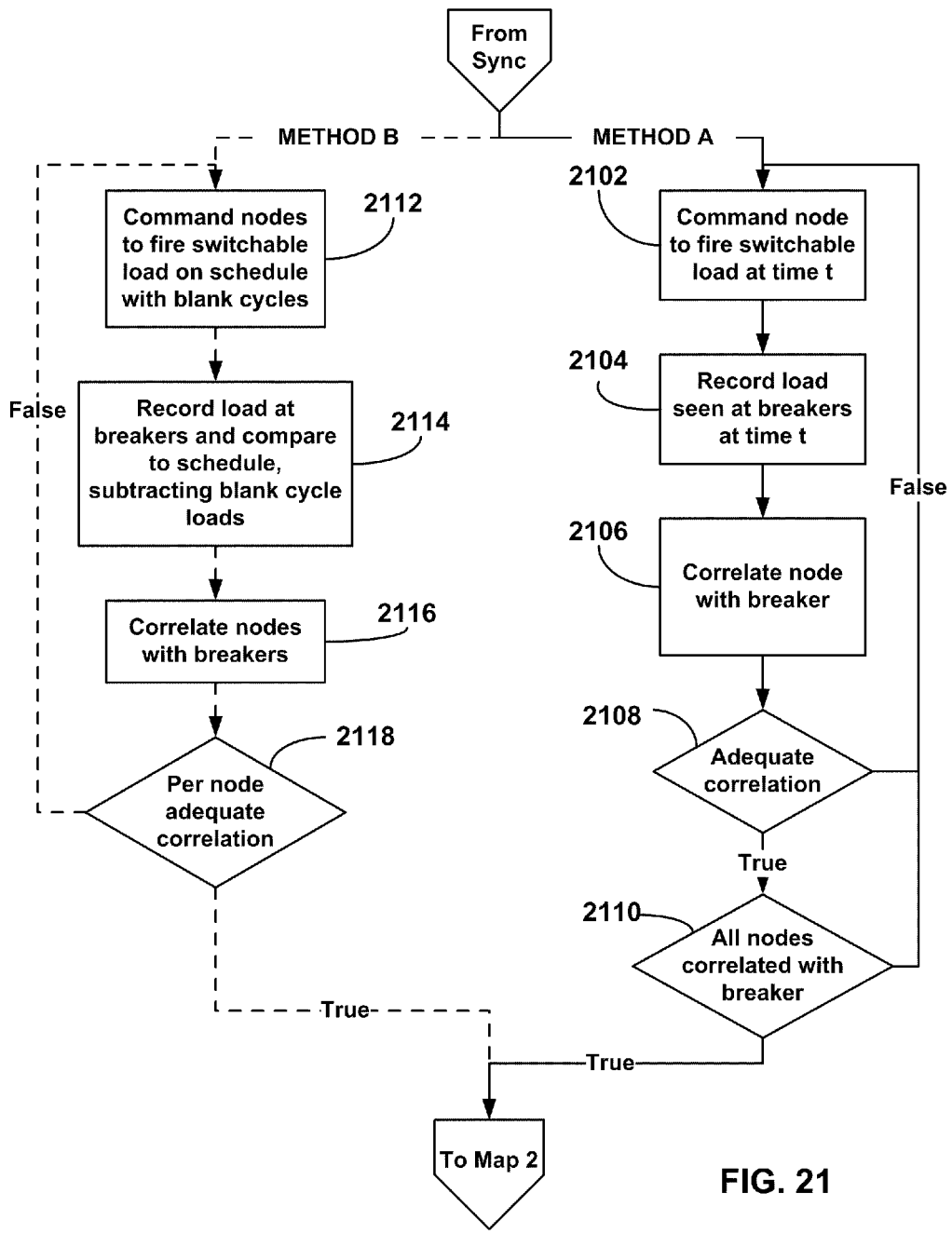
FIG. 21 is an example of methods for associating nodes with a particular circuit.

A first exemplary process of assigning individual nodes to breakers can be done on a node by node basis is illustrated in FIG. 21 as "Method A". A node may be given a command to trigger its switchable load at a known time at 2102. Each breaker monitors the power flowing through it at this time at 2104. The node may then be assigned to any breaker which observed the power flow caused by a node's switchable load at this time at 2106.

A second method, illustrated in FIG. 21 as "Method B" may include commanding all nodes to trigger their switchable load on a predetermined schedule, allowing blank cycles to precede and follow each switchable load event at 2112. The blank cycles between switchable load events may desensitize the mapping process to other loads which may be present. Loads seen during the blank cycles (or an average of this load during the blank cycle immediately preceding and following a switchable load event) may be subtracted to better detect the switchable load power draw at 2114. For the duration of the schedule, all breakers are commanded to monitor power flow. After the schedule is complete, information is gathered by the processor to determine which nodes should be assigned to which breakers at 2116.

For example individual nodes may be assigned to breakers according to the following methodology. For a given number of nodes n, and assuming that a micro-load uses energy "e" in one line cycle, all of the breakers may be commanded to measure energy flow on a line cycle by line cycle basis for 2n+1 line cycles, from line cycle a to line cycle a+2n inclusive. All nodes may be commanded to fire their micro-loads at 2112 on different line cycles, node 1 on line cycle a+1, node 2 on a+3, node 3 on a+5 and so on to node n on a+2n−1. Upon completion, the energy measurements may be retrieved from the breakers by the processor at 2114 and then the nodes may be correlated with the breakers at 2116. The energy flow in time cycle a+t in breaker b may be designated E[b][t].

The magnitude of difference in energy flow between a line cycle where a given node p's micro-load was fired, and the average of the adjacent cycles where no micro-load was fired, may then be calculated according to the following equation:

$$D[b][p] = |E[b][2p-1] - 0.5*(E[b][2p-2] + E[b][2p])|$$

If, for example, the threshold for determining whether the switchable load observed was 80% of the expected value, then if D[b][p]<0.2e then node p may not be present in breaker b's circuit. Otherwise if 0.8e<D[b][p]<1.2e then node p may be present in breaker b's circuit. If the conditions are not met at 2118, the measurement may be considered indeterminate and may be repeated. It may be appreciated that once all of the measurements and calculations are complete each node may be present under one and only one breaker's circuit (with the exception of breakers wired 'downstream' of other breakers) at 2118.

Figure 22:
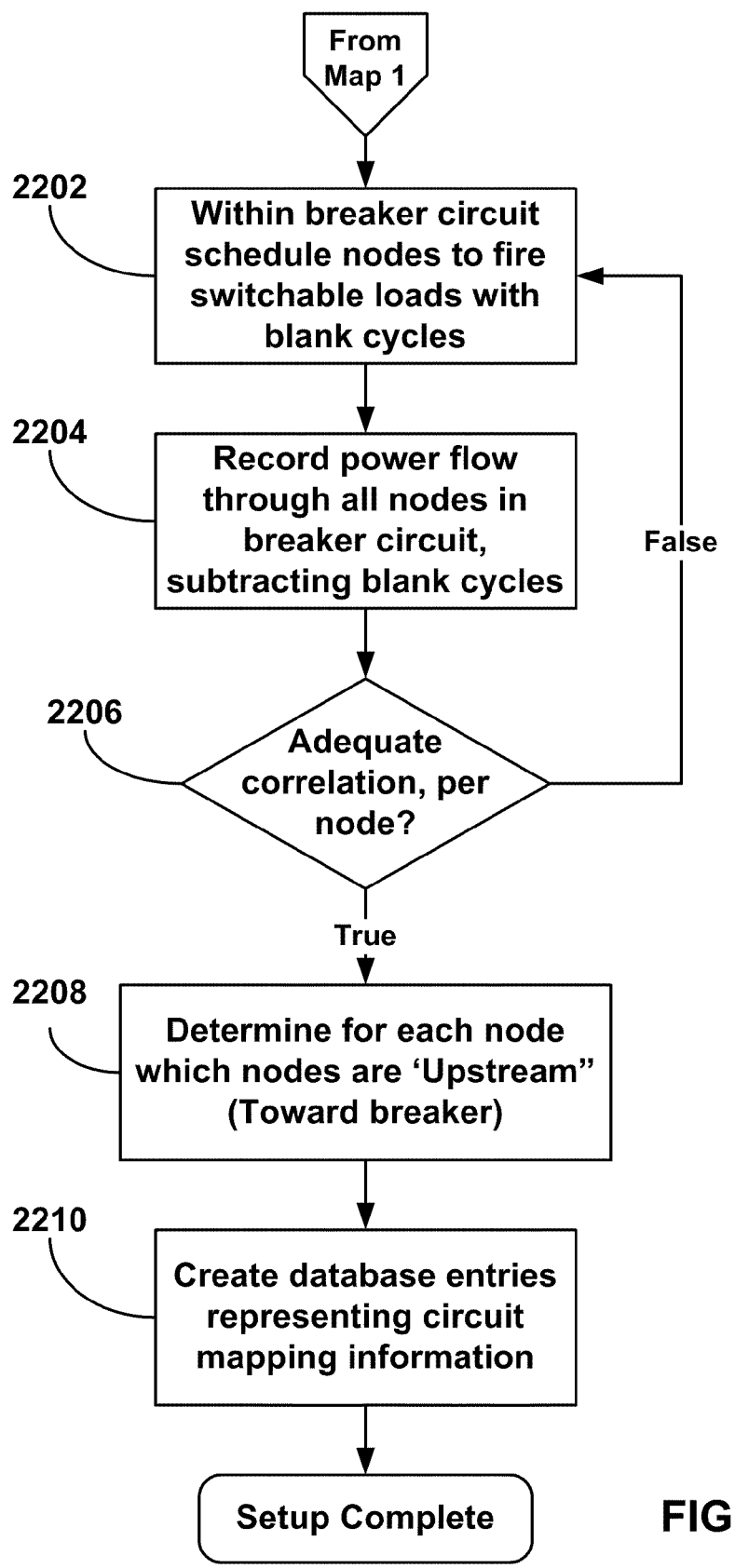
FIG. 22 is an example of a method for mapping nodes within a circuit.

After the nodes have been assigned to a breaker, the next logical step is to map the nodes within the breaker circuits, as illustrated in FIG. 22. The method may include commanding all nodes within the breaker circuit to trigger their switchable load on a predetermined schedule, allowing blank cycles to precede and follow each switchable load event. The blank cycles between switchable load events, as before, may desensitize the mapping process to other loads which may be present. Loads seen during the blank cycles (or an average of this load during the blank cycle immediately preceding and following a switchable load event) may be subtracted to better detect the switchable load power draw. For the duration of the schedule, all nodes within the breaker circuit may be commanded to monitor power flow. After the schedule is complete, information may be gathered by the processor to determine which nodes observe the switchable load of each other nodes, and are therefore deemed "upstream" of them, and thereby determine the circuit topology.

For example, mapping nodes within the breaker circuit may include the following. For a given number of nodes n in a sub-circuit to be mapped, and assuming that a micro-load uses energy e in one line cycle, all of the nodes may be set up to measure through energy flow on a line cycle by line cycle basis for 2n+1 line cycles, from line cycle a to line cycle a+2n inclusive. All nodes may be set to fire their micro-loads at 2202 on different line cycles, node 1 on line cycle a+1, node 2 on a+3, node 3 on a+5 and so on to node n on a+2n−1. The power flow through all the nodes in the breaker circuit may be recorded and upon completion of the measurements the energy measurements may be retrieved from the nodes by the processor at 2204. The measurements from blank cycles may be subtracted from those when loads were expected, as well. The energy flow in time cycle a+t through a node b is designated E[b][t].

The magnitude of difference in energy flow between a line cycle where a given node p's micro-load was fired, and the average of the adjacent cycles where no micro-load was fired, may then be calculated using the following equation.

$$D[b][p]=|E[b][2p-1]-0.5*(E[b][2p-2]+E[b][2p])|$$

If, for example, the threshold for determining whether the switchable load observed was 80% of the expected value, then if D[b][p]<0.2e then node p may not be downstream of node b. Otherwise if 0.8e<D[b][p]<1.2e then node p may be downstream of node b. If these conditions are not met, the measurement may be considered indeterminate and may be repeated at 2206.

A determination may then be made as to which nodes may be "upstream" or "downstream" relative to one another at 2208. Once all of the measurements and calculations are completed each node may have a subset of nodes for which it detected the presence of the switchable load, i.e., nodes which are "downstream" of it. A node may be determined to be "downstream" of itself or not depending upon the direction in which it is wired; this may be used to determine wiring orientation of a given node (e.g. whether the line in power is coming in at bottom lug of an outlet or the top lug). Any node "downstream" of no nodes other than the breaker node, may be directly connected to the breaker, with no intervening nodes. In addition, any node detected by such a node and the breaker only may be directly 'downstream' of such detecting node. This process may be iterated until all of the nodes may be accounted for, and hence mapped. Furthermore, in order to represent the circuit topology in the database, the record for each node may contain a pointer to the node immediately 'upstream' of it. Accordingly a database of entries representing circuit mapping information may be created at 2210.

If a particular node is not powered because of a switch in the off condition, it may not be initially mapped. However, once power is enabled to those nodes, they may make themselves known to the network via the processor (such as central computer 1402 of FIG. 14) which may then call for the newly found node or nodes to be synchronized and mapped in a similar manner to the previously described synchronization and mapping methods.

A user may interact with the system through a system interface. Referring back to FIG. 14, a system interface may be present at the central processor 1402 or may be integrated as a display panel 1412 in or proximate to the breaker panel 1404 itself, or anywhere else in communication with the nodes. Furthermore, multiple system interfaces may be provided or may interact with the system. For example, in addition to or instead of a display mounted on the power distribution center or central computer as illustrated in FIG. 14, information may be sent to the internet, over the powerline, or wirelessly over a router to a remote device, or may be sent over a network to a phone, etc.

Figure 23A:
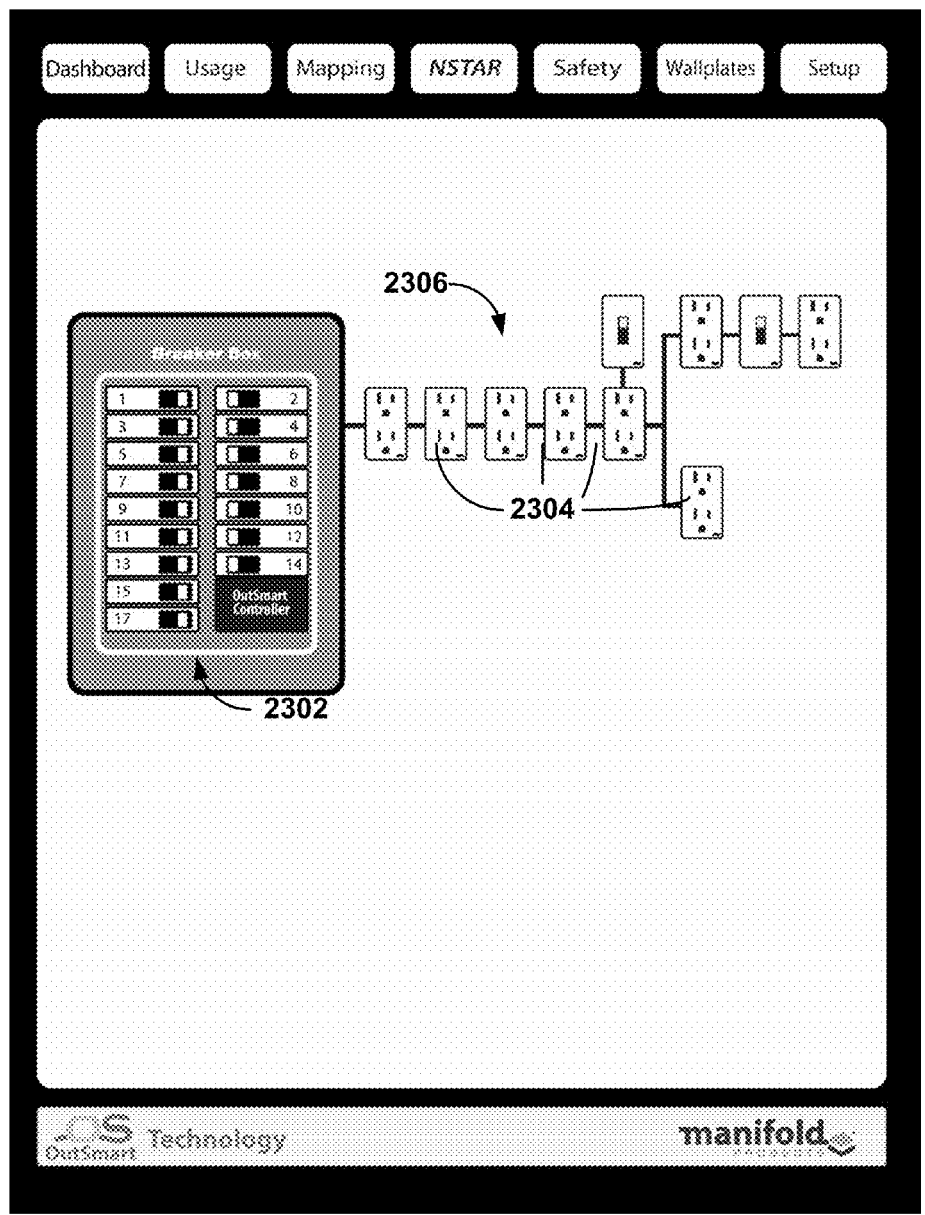
FIG. 23a is an example of a display interface for interacting with the system including a map of the nodes on the circuit.
Figure 23B:
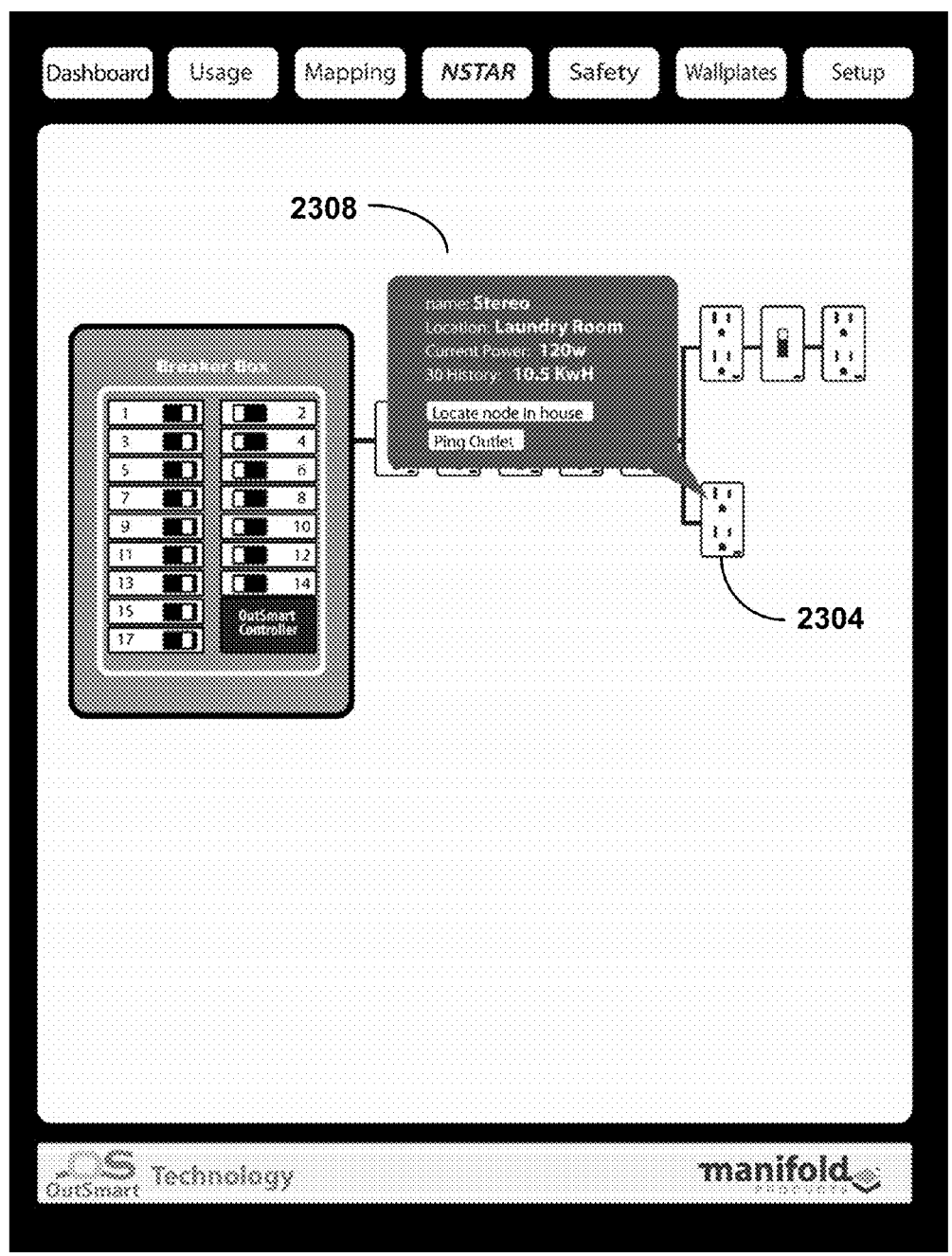
FIG. 23b is an example of a display interface for interacting with the system displaying information regarding a particular node on the circuit.

The interface may generally include a display and a mechanism for interacting with the system, such as a touch screen display, a mouse, keyboard, etc. As illustrated in FIG. 23*a*, the display may include a representation of the breaker box 2302 and the nodes 2304 mapped to a selected circuit 2306. By selecting a given node 2304 in the circuit 2306, as illustrated in FIG. 23*b* information 2308 may be displayed as to what may be plugged into the node, the current power usage of the node and the power used by the node over a given time period. It should be appreciated that other or additional information may be displayed as well.

The system may also allow for monitoring the power used at each node and, in fact, the power used at each outlet receptacle (top and bottom), as well as many other items (for instance, temperature, other environmental conditions, exact current draw profile . . . etc). In one example, data may be received by a processor that is indicative of power consumed or a load over a given period of time attached to one or more of the nodes. From this data a power consumption profiles for each node, as well as collective nodes (e.g., nodes of a given room or nodes of a given circuit) may be generated. While such a profile may consider power consumed over a period of time, including seconds, minutes, hours, days, weeks, months or years, the profile may also consider other variables, such as power usage, current draw, power factor, duty cycle, start up current, shut down current, standby power, line voltage, current wave form, time of day, date, location and/or environmental conditions or cross-correlations thereof. Furthermore, data regarding power cost may be utilized to develop cost profiles. A cross-correlation may be understood as the measurement of a similarity across two or more datasets. For example, power consumption and ambient temperature, lighting loads and time of day, start-up current and temperature, etc.

Where deviations of a predetermined amount from the profile are detected, an alert may be provided, power to the node may be cut, or an associated breaker may be tripped. The predetermined amount may be based on the overall profile or given segments of a profile related to time of day, or may be device specific. In addition, the predetermined amount may be based on cost, where energy pricing may be higher during a given time of the day.

Figure 24A:
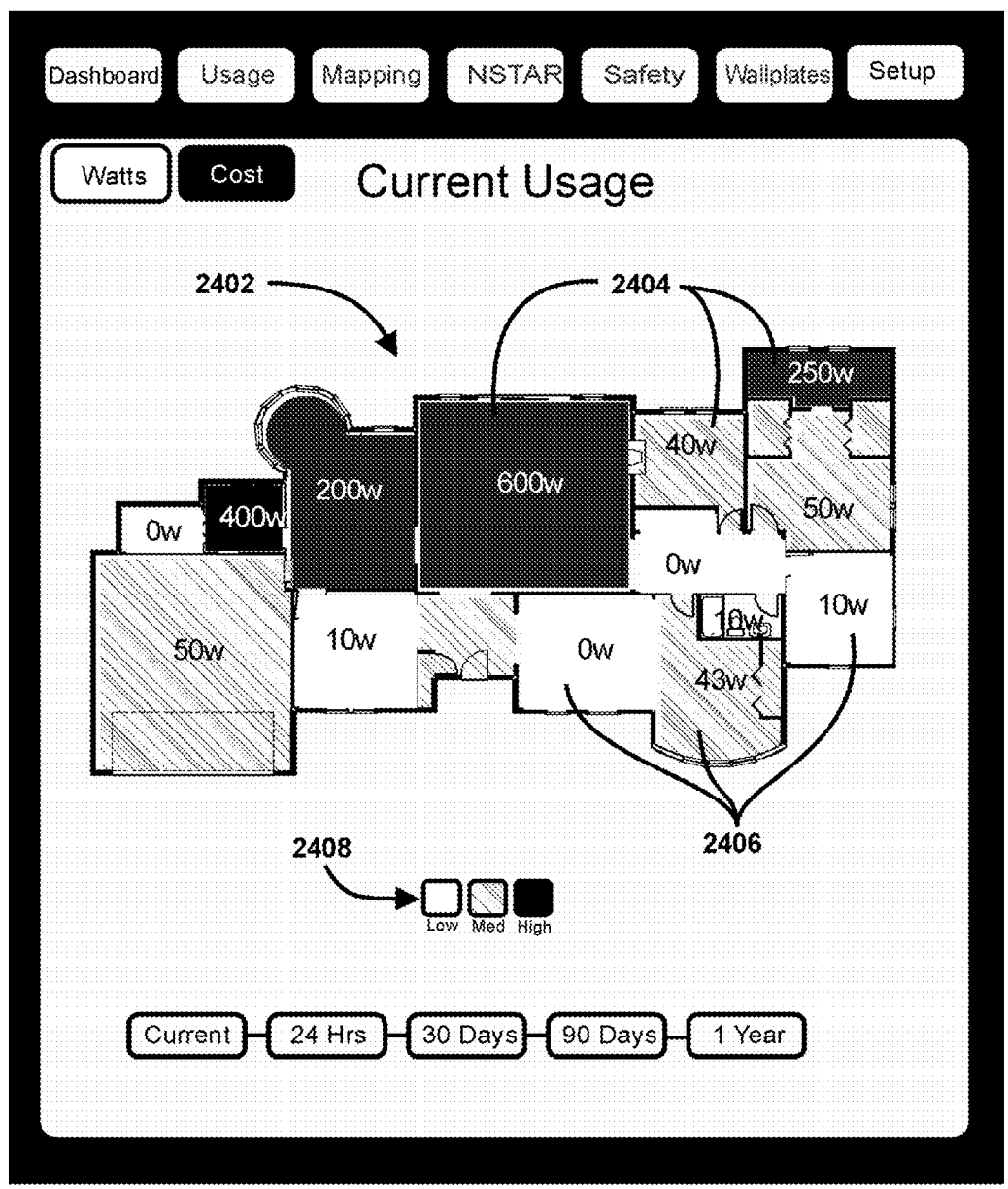
FIG. 24a is an example of a display interface providing information regarding power usage throughout a building.
Figure 24B:
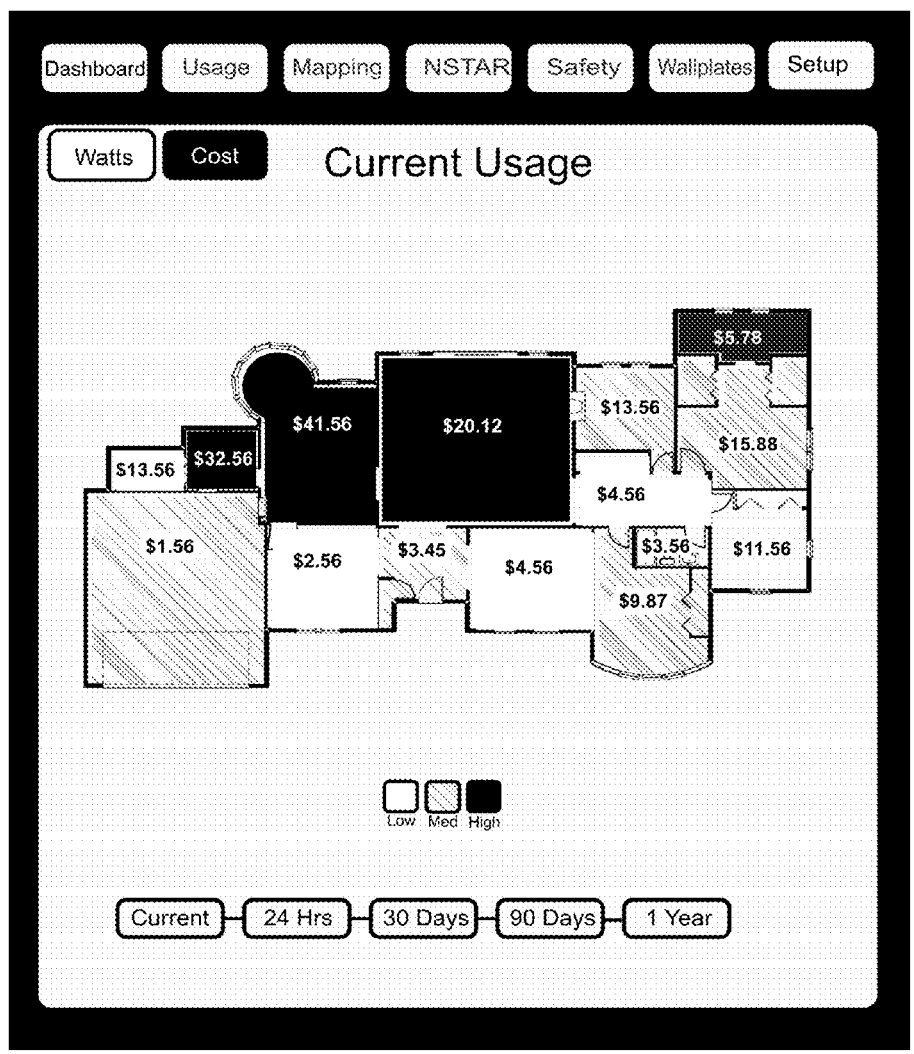
FIG. 24b is an example of a display interface providing information regarding the cost of power usage throughout a building.
Figure 25A:
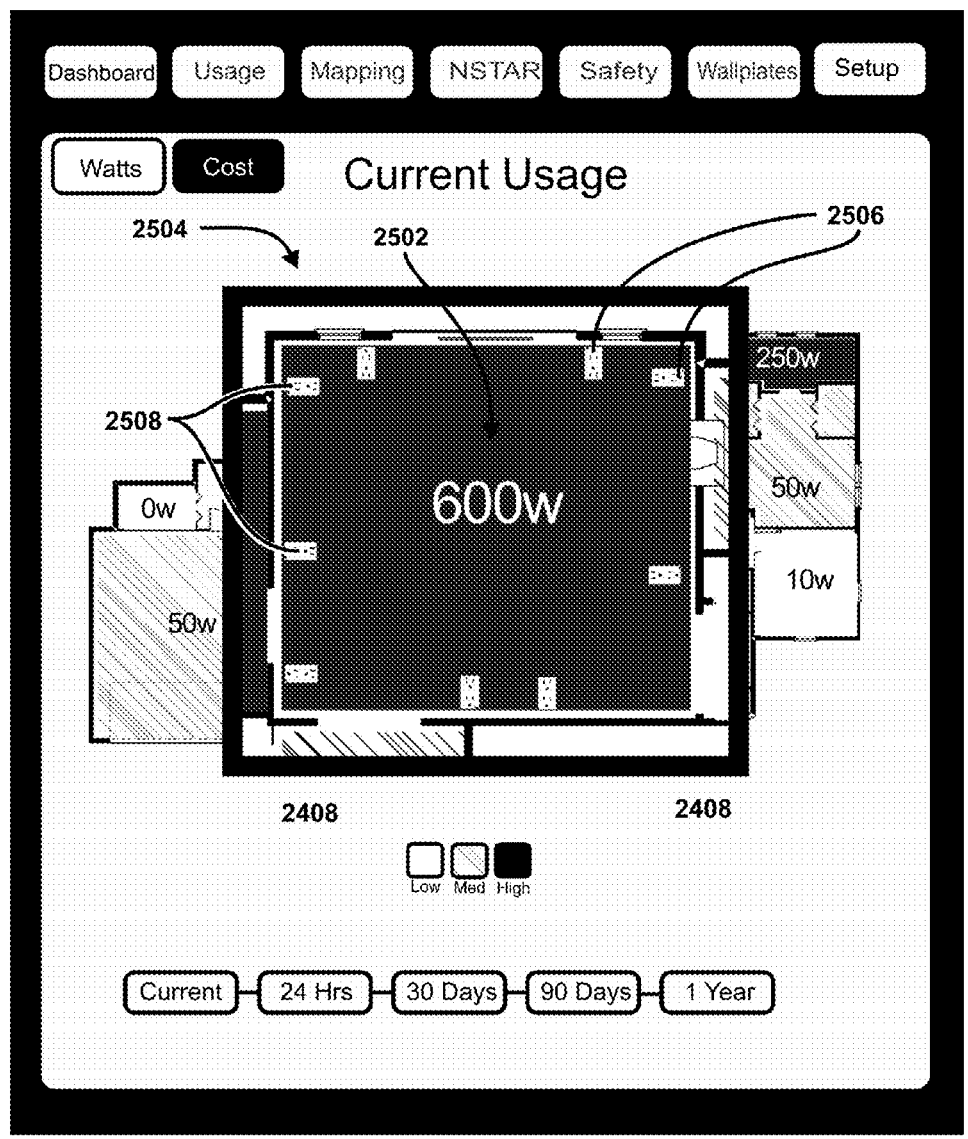
FIG. 25 is an example of a display interface providing information regarding the usage of power in a single room and the relative location of nodes throughout the room.
Figure 25B:
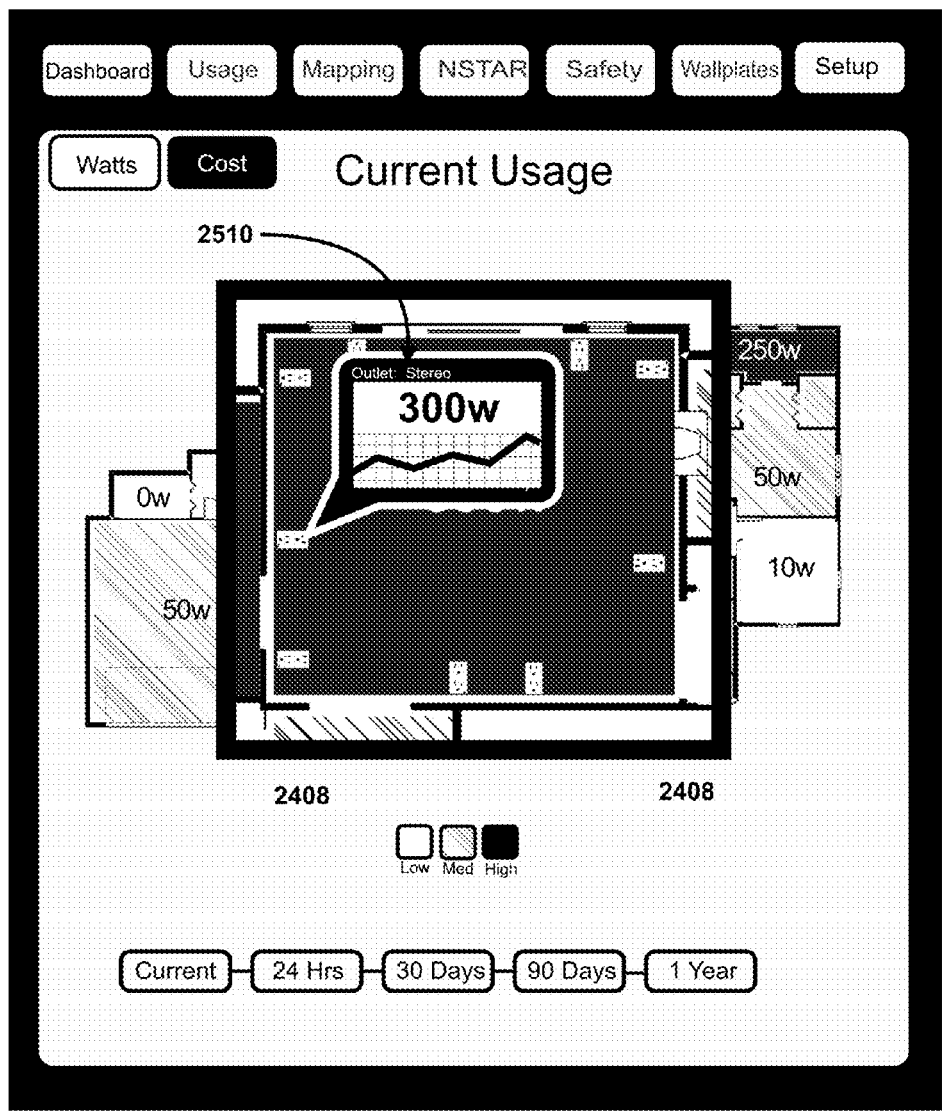

FIG. 24*a* is an illustration of how such data may be displayed to a user. For example the nodes may be associated with given rooms in a building, and determinations may be made as to the power usage of the various rooms, which may be broken down in a variety of units, such as Watts as illustrated in FIG. 24a, Watt-hours or monetary units as illustrated in FIG. 24b. The building 2402, rooms 2404 and power usage in each room 2406 may be displayed to a user. For reference purposes the usage may be quantified in terms of a color scale 1208. In addition, a representation of a specific room may be created, as illustrated in FIG. 25a, wherein information such as the power usage 2502 for the room 2504, node location 2506 or active nodes 2508 may be provided. Analysis of specific nodes may also be made, as illustrated in FIG. 25b, wherein usage at a given node may be determined, profiled 2510 or otherwise analyzed.

As may be appreciated from the above illustrations, the system may allow for the physical location of nodes to be correlated to a virtual diagram and the electrical location of a node and toroidal inductor within a wiring diagram may be correlated to the location of the physical (real) node. This may require a means of user input to the physical node, for example a button may be provided on the front of each node, and/or an audio, optical or other signal may also be provided which may be detectable by a user as to the location of a particular node.

Another aspect of the present disclosure relates to a means for using a unique serial number to identify devices that are connected to the network. These devices, which for example, may be plugged into a wall receptacle, may include a means (e.g., a chip) for modulating the current used by the device in such way that the nodes, which are capable of measuring current can identify the serial number. A serial number may be understood herein as one or more identifying numbers, letters, characters, pulses, signals, waveforms, or series thereof, which may be used to identify a device in a general (e.g. stove, refrigerator, etc.) or specific manner (e.g. exact type of refrigerator). Once the serial number is identified, the node (via distributed processing) or central processing can identify the device through a database. This database may include information such as make, model number, manufacturing information, expected modes and power draw, maintenance information . . . etc., all of which can be used to identify problems, schedule maintenance and provide market research as to product usage, among a variety of other uses. The database may be available locally, or accessible through a variety of means, including the internet, cable, telephone . . . etc. The system may also be configured to map such devices drawing power from the circuit.

Safety systems are also contemplated herein. For example, the node may be programmed to sense whether a plug has been inserted into a receptacle. In some embodiments, the receptacle may only turn on power when two or more prongs are inserted into the receptacle simultaneously or are fully inserted into the receptacle. When the prongs are removed from the receptacle, the receptacle may remove or disconnect supply power to the receptacle. Circuitry and sensors may monitor the receptacle for the insertion of prongs and when the prongs are received supply power may again be applied to the receptacle.

Figure 26:
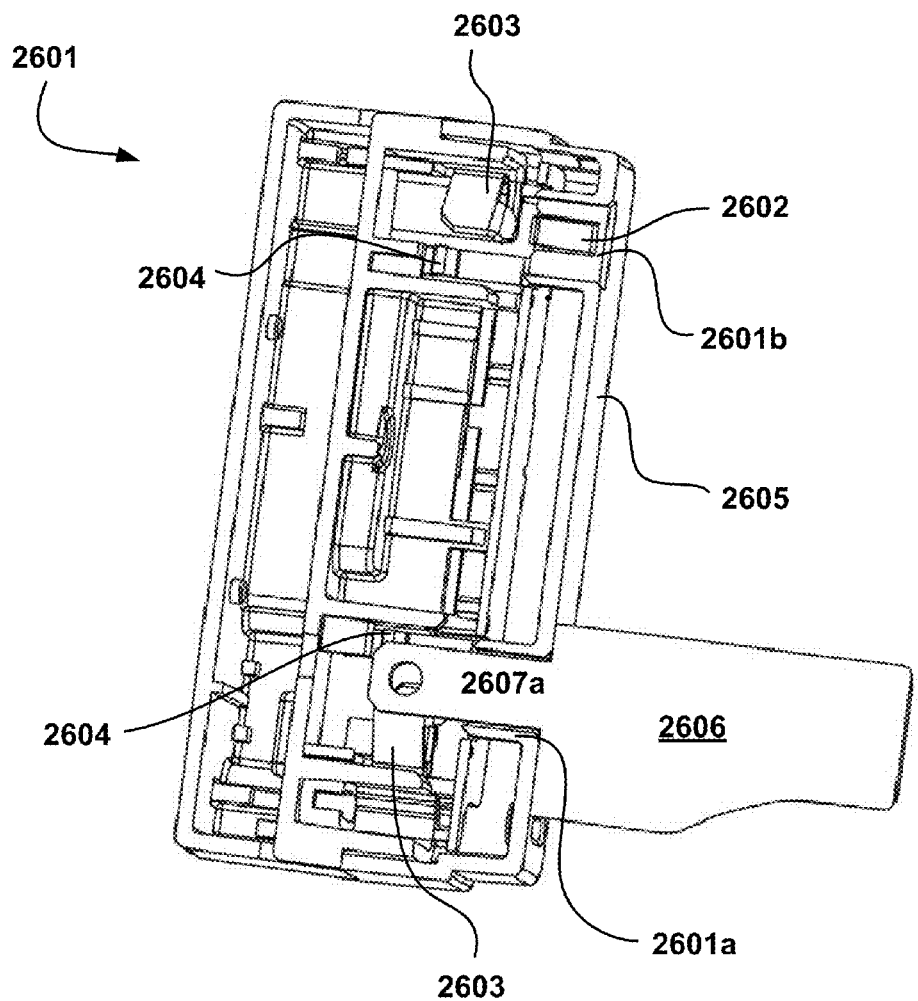
FIG. 26 is an illustration of an outlet including contacts for sensing the presence of a plug prong.

In one example, metal contacts (engagement sensors) may be located within a receptacle and placed in the path of a mating plug. FIG. 26 illustrates a cross section of a dual receptacle 2601 through two of the outlets 2601a and 2601b openings, wherein a plug 2606 is shown engaged into the lower outlet 2601b. The figure shows how the engagement sensors may be oriented within the receptacle on the side of the assembly, in which the line prong of a plug 2607a may be inserted. Specifically contact 2602 may be an engagement sensor proximal to the front of the receptacle housing 2605 in the plug aperture opening, line contact 2603 may provide power to the plug and contact 2604 may be an engagement sensor that may be distal from the front of the housing 2605 and farther within the housing than the line contact 2603. When the plug 2606 is fully inserted, it may be in contact with contacts 2602, 2603 and 2604. This may put contacts 2602 and 2604 at line potential.

Figure 27:
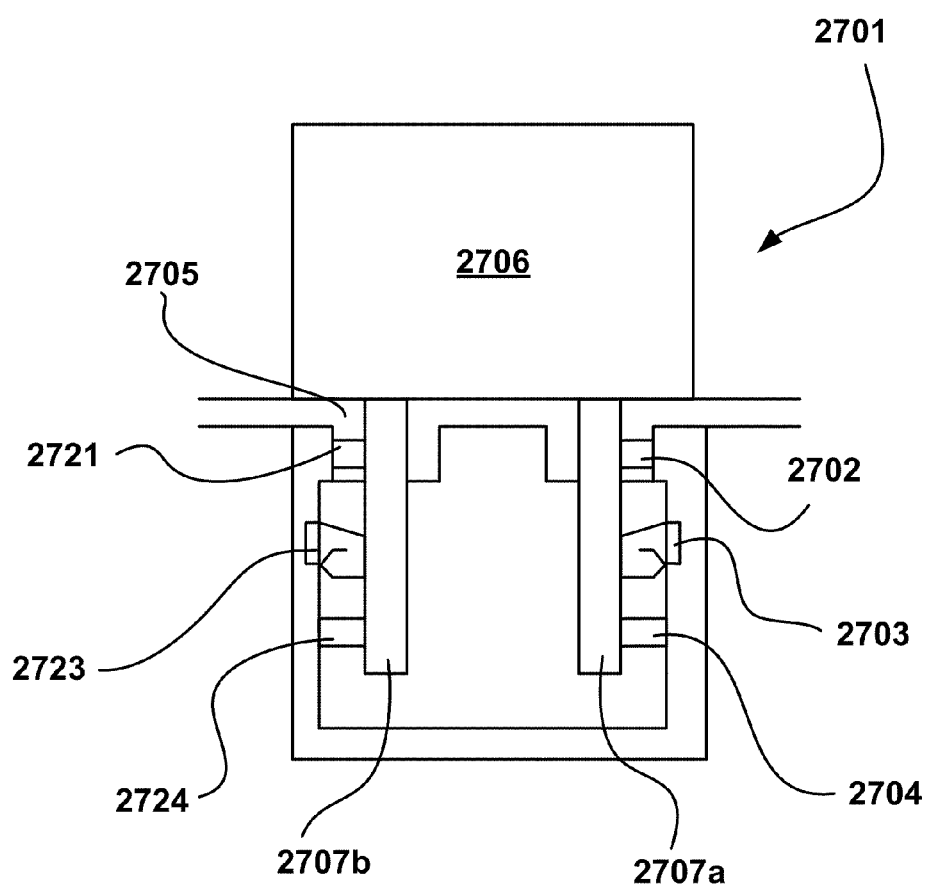
FIG. 27 is another illustration of an outlet including contacts for sensing the presence of a plug prong.

FIG. 27 shows a top down view of an receptacle 2701 including a plug 2706 positioned within a receptacle 2701 having a line prong 2707a and a neutral prong 2707b. As discussed above, the line prong may be engaged by contacts 2702 and 2704 as well as line contact 2703. Similarly, the neutral prong 2707b may be engaged by contacts 2721 and 2724 as well as neutral contact 2723. Contact 2721 may also be an engagement sensor proximal to the front of the receptacle housing 2705 and contact 2724 may be an engagement sensor that may be distal to the housing, farther within the housing than the neutral contact 2723.

Referring again to FIG. 26, embedded electronics, such as a node described above, may be used to sense that both contacts 2602 and 2604 are at line potential and thus that the plug is fully inserted. Below is a table which shows the possible plug positions and corresponding potential of contacts 2602, 2603 and 2604.

| Contact | Plug Fully Inserted | Plug Partially Inserted | Plug Not Inserted |
| --- | --- | --- | --- |
| 2602 | Line | Line | Floating |
| 2603 | Line | Line | Line |
| 2604 | Line | Floating | Floating |

Using feedback from contacts 2602 and 2604 it may be possible to determine when the plug is fully inserted or just partially inserted thereby providing a valuable safety feature.

In some examples, as illustrated in FIG. 27, contact 2704, in conjunction with the other contacts may be used to detect partial insertion of the plug. If contact 2704 is weakly biased to a voltage other than line (e.g. neutral) and the voltage is measured, then if the voltage on 2704 is the same as that at 2702 then a determination may be made that there is a prong sufficiently inserted to maintain contact with 2704. If the voltage is not essentially the same as that at contact 2702 then there is no prong sufficiently inserted to make electrical contact between 2707 and 2704. If, at the same time, contact 2702 is at line voltage, such that a prong may be inserted sufficiently to join contact 2702 to line contact 2703, such an arrangement may indicate that a potentially unsafe condition exists, e.g. a partially inserted prong. If contact 2702 is not at line voltage then there may be no prong reaching line contact 2603, and power may not be delivered any prong present.

It may be appreciated that contacts 2702 and 2704 may also be used to ascertain the quality of the electrical connection between the plug prongs 2707a and 2707b and the line and neutral contacts 2703 and 2723 respectively, provided that the voltage into the receptacle (supplied voltage) is known to the system. If the voltage sensed between contacts 2702 and 2721 is less than the known supply voltage, the connection between the plug prong 2707a and line contact 2703, or between prong 2707b and neutral contact 2723 may be less than optimal.

In addition, using contacts 2702 and 2721, as illustrated in FIG. 27, the voltage between the prongs of the plug may be measured; this voltage is measured independently from the voltage between contacts 2703 and 2723. This means that the power estimated by combining this voltage measurement with a measurement of the current in the circuit, may be that transferred to the plug. If the power being delivered to the receptacle is known, the losses between the contact 2723 and the neutral prong 2707*b*, and 2703 and the line prong 2707*a* can be estimated. This may provide information about a potentially dangerous condition where too much power is being lost in the contacts to the plug prongs. Furthermore, it may be appreciated that a voltage may be measured between at least one of the prongs and a reference point, including, for example, ground, neutral or another point of constant potential. In addition, it may be appreciated that the voltage between a contact and a load may be determined. Again, a load may be understood as the power consumed by a device which is plugged into a receptacle and engaging the contacts.

The above measurements may be performed by node electronics, including, but not limited to, the power measurement device, a microcontroller, etc. Power measurement data may be calculated by the node microprocessor but could be done elsewhere in the system. Likewise, energy losses may be calculated at a central location but could be done locally.

It may be further appreciated that the signals generated by these contacts may trigger an alarm, audible or otherwise, to alert a user to a potentially dangerous condition in the system. The alarm may be embedded in the electronics, such as in the node electronics or provided by an appliance as described above. Additionally, the alarm may result in the system removing power from the circuit or part of the circuit where a fault has been detected. The alarm trigger may have a built in delay such that the act of inserting or removing a plug may not cause an alarm.

Similar functionality may also be derived from other methods. Instead of metal contacts it may be desirable to use mechanical switches or optical sensors. Either of these devices may be arranged in much the same way as metal contacts 2602 and 2604 such that one may be able to sense if a plug were only partially inserted. With both of these devices (i.e., mechanical switch and/or optical sensor) it may be possible to sense the presence of a non-metallic object within the receptacle. The system may alert users or initiate an alarm should a foreign (i.e. non-metallic) object be inserted into the socket.

The foregoing description of several methods and embodiments has been presented for purposes of illustration. It is not intended to be exhaustive or to limit the disclosure to the precise steps and/or forms disclosed, and obviously many modifications and variations are possible in light of the above teaching.

What is claimed is:

1. An electrical receptacle configured to receive a plug having two or more prongs and capable of being connected to an associated load comprising:
   a housing;
   a housing cover mounted on said housing including apertures for receiving at least one of said prongs;
   at least two electrical contacts for engaging said prongs positioned in said housing;
   a magnetic current sensor including a toroidal inductor defining an opening, wherein said toroidal inductor opening is operatively coupled to an opening defined by at least one of said apertures wherein when one of said prongs is inserted through one of said apertures, said prong extends through said toroidal inductor opening and engages at least one of said electrical contacts.

2. The electrical receptacle of claim 1, further comprising a node including a microcontroller in communication with said magnetic current sensor.

3. The electrical receptacle of claim 2, wherein said node includes a power measurement device in electrical communication with said magnetic current sensor and said contacts and said microcontroller.

4. The electrical receptacle of claim 3, wherein said power measurement device includes an analog to digital converter.

5. The electrical receptacle of claim 1, wherein said toroidal inductor assumes the shape of a rectoid.

6. The electrical receptacle of claim 1, wherein said toroidal inductor forms a closed magnetic path around a prong.

7. The electrical receptacle of claim 1, further comprising a front cover including a number of openings through which said one or more prongs pass.

8. The electrical receptacle of claim 1, wherein said front cover includes a display configured to display power consumption information.

9. The electrical receptacle of claim 1, further comprising a first engagement sensor located between said housing cover and one of said electrical contacts wherein said first engagement sensor contacts at least one of said prongs when said prong is inserted into one of said apertures.

10. The electrical receptacle of claim 1, further comprising a second engagement sensor located in said housing distal from said housing cover wherein one of said electrical contacts is located between the second engagement sensor and the housing cover.

11. The electrical receptacle of claim 1, wherein at least two of said electrical contacts is capable of carrying current and wherein said electrical receptacle further comprises node electronics, wherein said node electronics are configured to estimate voltage between all of said electrical contacts to the load.

12. The electrical receptacle of claim 11, further comprising a node configured to measure a voltage between at least one of said prongs and a reference point.

13. The electrical receptacle of claim 1, further comprising a node configured to estimate energy used by the receptacle.

14. The electrical receptacle of claim 1, wherein when one of said prongs upon insertion into said receptacle and extension through said toroidal inductor opening with engagement to said electrical contact induces a magnetic flux in said toroidal inductor and said receptacle is configured to measure said magnetic flux and determine power consumption through said prong.

15. The electrical receptacle of claim 14, wherein said receptacle is configured to store and/or send information regarding said power consumption over a wired network.

16. The electrical receptacle of claim 14, configured to store and/or send information regarding measured or estimated energy based on said power consumption over a wireless network.

17. An electrical receptacle for receiving a plug having two or more prongs comprising:
   a housing;
   a housing cover mounted on said housing including apertures for receiving at least one of said prongs;
   at least two electrical contacts for engaging said prongs positioned in said housing;
   a magnetic current sensor including a toroidal inductor defining an opening, wherein said toroidal inductor opening is operatively coupled to an opening defined by at least one of said apertures wherein when one of said prongs is inserted through one of said apertures, said prong extends through said toroidal inductor opening and engages at least one of said electrical contacts;

a power measurement device in electrical communication with said magnetic current sensor and said electrical contacts;

wherein when one of said prongs upon insertion into said receptacle and extension through said toroidal inductor opening with engagement to said electrical contact induces a magnetic flux in said magnetic current sensor and said receptacle is configured to measure said magnetic flux and determine power consumption through said prong.

18. A method of monitoring power consumption of an electrical receptacle configured to receive a plug having two or more prongs comprising:

supplying an electrical receptacle including a housing, said housing including a housing cover mounted on said housing including apertures for receiving at least one of said prongs, at least two electrical contacts for engaging said prongs positioned in said housing, a magnetic current sensor including a toroidal inductor defining an opening, wherein said toroidal inductor opening is operatively coupled to an opening defined by at least one of said apertures wherein when one of said prongs is inserted through one of said apertures, said prong extends through said toroidal inductor opening and engages at least one of said electrical contacts;

passing current through said prong and generating a magnetic flux; and measuring a voltage and determining power consumption from said magnetic flux and said voltage.

19. A system for monitoring power consumption of two or more receptacles over a network comprising:

a conductive pathway; and one or more electrical receptacles in electrical communication with said conductive pathway each configured to receive one or more plugs having two or more prongs, wherein said one or more electrical receptacles include a housing, a housing cover mounted on said housing including apertures for receiving at least one of said prongs, at least two electrical contacts for engaging said prongs positioned in said housing, a magnetic current sensor including a toroidal inductor defining an opening, wherein said toroidal inductor opening is operatively coupled to an opening defined by at least one of said apertures wherein when one of said prongs is inserted through one of said apertures, said prong extends through said toroidal inductor opening and engages at least one of said electrical contacts.

20. The system of claim 19, wherein said one or more electrical receptacles each comprise node electronics including a power measurement device in electrical communication with said magnetic current sensor.

21. The system of claim 20, wherein said node electronics further includes a microcontroller in electrical communication with said power measurement device, wherein said microcontroller is in electrical communication with said conductive pathway.

22. The system of claim 19, further comprising a processor in electrical communication with said conductive pathway and said microcontroller in said node in said one or more electrical receptacles.

23. An electrical receptacle for receiving a plug having two or more prongs, comprising:

a housing;

a housing cover mounted on said housing including apertures for receiving at least one of said prongs;

at least two electrical contacts for engaging said prongs when positioned in said housing; and a first engagement sensor located between said housing cover and one of said electrical contacts, wherein said receptacle is configured to turn power on when said prong is fully positioned in said receptacle as determined by feedback from said first engagement sensor.

24. The electrical receptacle of claim 23, further comprising a second engagement sensor located in said housing distal from said housing cover wherein one of said electrical contacts is located between the second engagement sensor and the housing cover.

25. The electrical receptacle of claim 23, wherein at least two of said electrical contacts is capable of carrying current and wherein said electrical receptacle further comprises node electronics, wherein said node electronics are configured to estimate voltage between all of said electrical contacts to the load.

26. The electrical receptacle of claim 23, further comprising a node configured to measure a voltage between at least one of said prongs and a reference point.

* * * * *